(12) United States Patent
Du et al.

(10) Patent No.: US 11,915,761 B2
(45) Date of Patent: Feb. 27, 2024

(54) MEMORY DEVICE AND PROGRAM OPERATION THEREOF

(71) Applicant: YANGTZE MEMORY TECHNOLOGIES CO., LTD., Wuhan (CN)

(72) Inventors: Zhichao Du, Wuhan (CN); Yu Wang, Wuhan (CN); Haibo Li, Wuhan (CN); Ke Jiang, Wuhan (CN); Ye Tian, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 335 days.

(21) Appl. No.: 17/483,350

(22) Filed: Sep. 23, 2021

(65) Prior Publication Data

US 2022/0013176 A1    Jan. 13, 2022

Related U.S. Application Data

(63) Continuation of application No. PCT/CN2021/094511, filed on May 19, 2021.

(30) Foreign Application Priority Data

May 19, 2021    (WO) ................ PCT/CN2020/091037

(51) Int. Cl.
*G11C 16/10* (2006.01)
*G11C 16/04* (2006.01)
(Continued)

(52) U.S. Cl.
CPC ............ *G11C 16/10* (2013.01); *G06F 13/102* (2013.01); *G06F 13/24* (2013.01);
(Continued)

(58) Field of Classification Search
CPC ..... G11C 16/10; G11C 16/0483; G11C 16/08; G11C 16/26; G11C 11/5671; G06F 13/102; G06F 13/24; H10B 43/27
See application file for complete search history.

(56) References Cited

U.S. PATENT DOCUMENTS 3,858,060 A    12/1974   Kenyon
4,344,154 A     8/1982   Klaas et al.
(Continued)

FOREIGN PATENT DOCUMENTS

CN    105336367 A    2/2016
CN    107112047 A    8/2017
(Continued)

OTHER PUBLICATIONS

International Search Report issued in correspoding International Application No. PCT/CN2021/094511, dated Aug. 26, 2021, 4 pages.

*Primary Examiner* — Henry Tsai
*Assistant Examiner* — John B Roche
(74) *Attorney, Agent, or Firm* — BAYES PLLC

(57) ABSTRACT

In certain aspects, a memory device includes a memory string including a drain select gate (DSG) transistor, a plurality of memory cells, and a source select gate (SSG) transistor, and a peripheral circuit coupled to the memory string. The peripheral circuit is configured to in response to an interrupt during a program operation on a select memory cell of the plurality of memory cells, turn on at least one of the DSG transistor or the SSG transistor. The peripheral circuit is also configured to suspend the program operation after turning on the at least one of the DSG transistor or the SSG transistor.

20 Claims, 17 Drawing Sheets

(51) Int. Cl.
*G11C 16/26* (2006.01)
*G06F 13/10* (2006.01)
*G06F 13/24* (2006.01)
*G11C 16/08* (2006.01)
*G11C 11/56* (2006.01)
*H10B 43/27* (2023.01)

(52) U.S. Cl.
CPC .......... *G11C 16/0483* (2013.01); *G11C 16/08* (2013.01); *G11C 16/26* (2013.01); *G11C 11/5671* (2013.01); *H10B 43/27* (2023.02)

(56) References Cited

U.S. PATENT DOCUMENTS

| | | | |
|---|---|---|---|
| 5,216,630 A | 6/1993 | Nakase | |
| 5,687,121 A * | 11/1997 | Lee | G11C 16/3418 365/185.11 |
| 5,719,807 A | 2/1998 | Sali et al. | |
| 5,822,252 A | 10/1998 | Lee et al. | |
| 6,031,329 A | 2/2000 | Nagano | |
| 9,030,877 B2 | 5/2015 | Strenz et al. | |
| 10,665,306 B1 | 5/2020 | Chen et al. | |
| 2002/0089024 A1 * | 7/2002 | Iwata | B82Y 10/00 257/421 |
| 2004/0184331 A1 | 9/2004 | Hanzawa et al. | |
| 2005/0276118 A1 | 12/2005 | Maayan | |
| 2006/0215453 A1 | 9/2006 | Seong | |
| 2006/0285388 A1 | 12/2006 | Ha et al. | |
| 2007/0150770 A1 * | 6/2007 | Lee | G11C 7/20 713/323 |
| 2007/0183199 A1 | 8/2007 | Chung | |
| 2007/0297242 A1 | 12/2007 | Kuriyama | |
| 2008/0180997 A1 | 7/2008 | Park et al. | |
| 2008/0239847 A1 | 10/2008 | Jung et al. | |
| 2012/0257450 A1 | 10/2012 | Yip | |
| 2013/0205085 A1 | 8/2013 | Hyun | |
| 2013/0283872 A1 | 10/2013 | Bisson et al. | |
| 2013/0326162 A1 | 12/2013 | Moon et al. | |
| 2013/0326163 A1 | 12/2013 | Moon et al. | |
| 2014/0317344 A1 | 10/2014 | Kim | |
| 2014/0369134 A1 | 12/2014 | Baik et al. | |
| 2016/0012891 A1 | 1/2016 | Intrater et al. | |
| 2016/0172042 A1 | 6/2016 | Kang | |
| 2016/0314826 A1 | 10/2016 | Augstine et al. | |
| 2017/0169897 A1 * | 6/2017 | Lee | G11C 16/3459 |
| 2017/0301403 A1 | 10/2017 | Pang et al. | |
| 2018/0151237 A1 | 5/2018 | Lee et al. | |
| 2018/0197610 A1 | 7/2018 | Lee | |
| 2018/0204620 A1 | 7/2018 | Kim et al. | |
| 2019/0171360 A1 | 6/2019 | Lee et al. | |
| 2019/0325962 A1 | 10/2019 | Sheikh et al. | |
| 2019/0333592 A1 | 10/2019 | Lee et al. | |
| 2019/0333593 A1 | 10/2019 | Lee et al. | |
| 2020/0160910 A1 | 5/2020 | Hsu | |
| 2020/0243145 A1 | 7/2020 | Yamada | |
| 2020/0294571 A1 | 9/2020 | Shin | |
| 2020/0350029 A1 | 11/2020 | Kim et al. | |
| 2021/0183450 A1 | 6/2021 | Sharma et al. | |

FOREIGN PATENT DOCUMENTS

| | | |
|---|---|---|
| CN | 110033808 A | 7/2019 |
| WO | 2016069487 A1 | 5/2016 |

* cited by examiner

MEMORY DEVICE AND PROGRAM OPERATION THEREOF

CROSS-REFERENCE TO RELATED APPLICATIONS

This application is continuation of International Application No. PCT/CN2021/094511, filed on May 19, 2021, entitled "MEMORY DEVICE AND PROGRAM OPERATION THEREOF," which is hereby incorporated by reference in its entirety. This application also claims the benefit of priorities to International Application No. PCT/CN2020/091037, filed on May 19, 2020, entitled "CONTRL METHOD AND CONTROLLER OF PROGRAM SUSPENDING AND RESUMING FOR MEMORY," which is incorporated herein by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes a memory string including a drain select gate (DSG) transistor, a plurality of memory cells, and a source select gate (SSG) transistor, and a peripheral circuit coupled to the memory string. The peripheral circuit is configured to in response to an interrupt during a program operation on a select memory cell of the plurality of memory cells, turn on at least one of the DSG transistor or the SSG transistor. The peripheral circuit is also configured to suspend the program operation after turning on the at least one of the DSG transistor or the SSG transistor.

In another aspect, a system includes a memory device configured to store data, a memory controller coupled to the memory device, and a connector configured to couple the system to a host. The memory device includes a memory string including a DSG transistor, a plurality of memory cells, and an SSG transistor, and a peripheral circuit coupled to the memory string. The peripheral circuit is configured to initiate a program operation on a select memory cell of the plurality of memory cells, and receive an interrupt command during the program operation. The peripheral circuit is also configured to in response to receiving the interrupt command, turn on at least one of the DSG transistor or the SSG transistor. The peripheral circuit is further configured to suspend the program operation after turning on the at least one of the DSG transistor or the SSG transistor. The memory controller is configured to transmit a program command to the peripheral circuit to initiate the program operation, and transmit the interrupt command after the program command to the peripheral circuit.

In still another aspect, a method for operating a memory device is provided. The memory device includes a memory string including a DSG transistor, a plurality of memory cells, and an SSG transistor. A program operation is initiated on a select memory cell of the plurality of memory cells. An interrupt command is received during the program operation. In response to receiving the interrupt command, at least one of the DSG transistor or the SSG transistor is turned on. The program operation is suspended after turning on the at least one of the DSG transistor or the SSG transistor.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
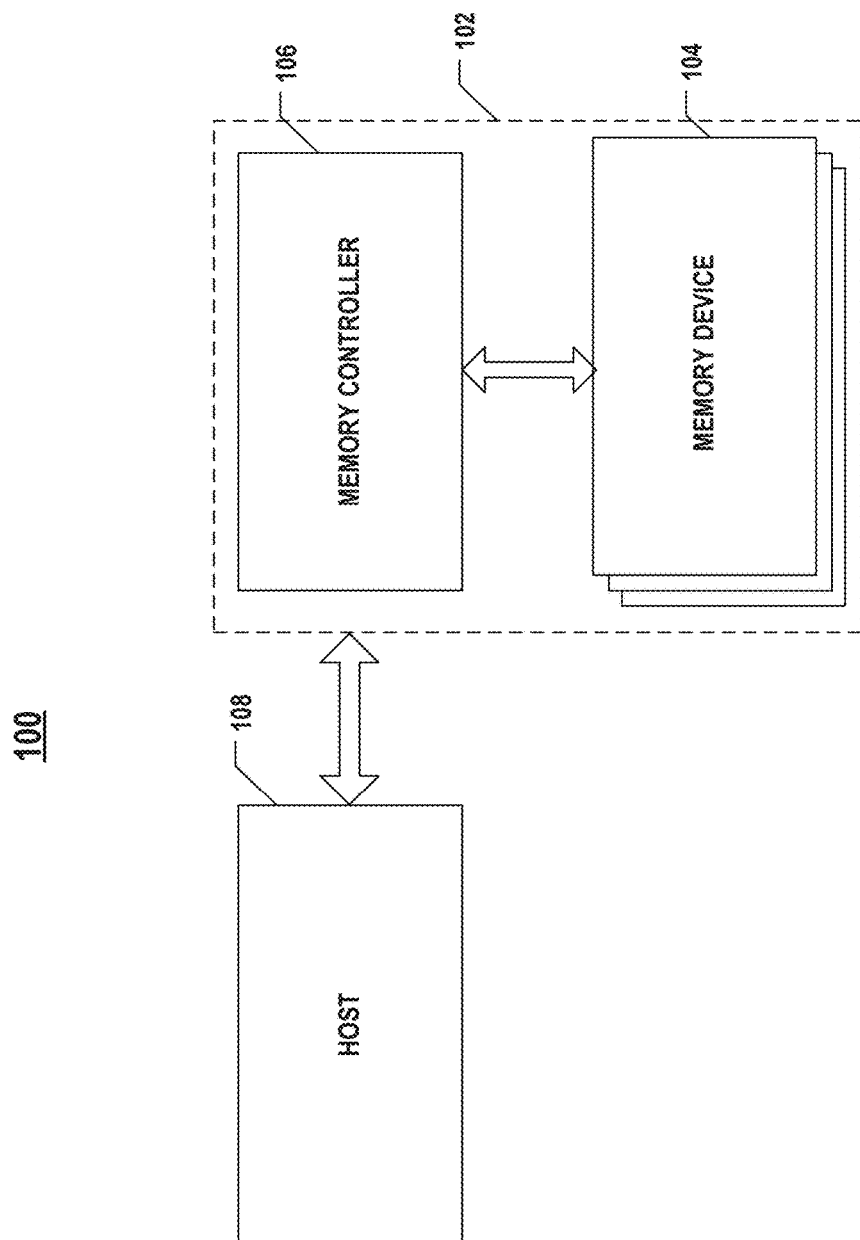
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

NAND Flash memory devices can perform program (write) operations at the page/word line level, i.e., programming all the memory cells coupled to the same select word line at the same time. Since each program operation takes a relatively long time (e.g., several hundred of microseconds (μS)) as it may involve multiple passes, each having multiple cycles of applying program pulses and verify pulses, NAND Flash memory devices usually support interrupts during a program operation on one page to suspend the ongoing program operation and switch to another operation (e.g., a read operation on another page). Once the other operation is finished, the suspended program operation can be resumed to program the original page.

During the suspended period (e.g., between the time when the program operation is suspended and the time when the program operation is resumed), the channel of each select memory string (e.g., a NAND memory string) is floating because both the drain select gate (DSG) transistors and source select gate (SSG) transistors at the drain and source ends, respectively, are turned off. The discharge of the program voltage applied on the select word line when programing the select page, in conjunction with the coupling capacitor between the select word line and the channel may cause a negative coupling potential in the channel. As a result, holes may be attracted by the negative potential, for example, from the P-well coupled to the source of the select memory string and accumulated in the channel and the charge trap layer of the select memory cell. The longer the suspended period is, the more holes may be accumulated.

The extra holes accumulated during the program suspended period can increase the threshold voltage of the select memory cell, such that when the program operation is resumed, the select memory cell is easier to pass the verification even though the select memory cell may not be programmed to the desired threshold voltage level. Moreover, once the negative potential in the channel of the select memory string disappears after the program operation is resumed, the accumulated holes may be released as well, thereby reducing the threshold voltage. As a result, more fail bits can occur during the subsequent read operations at the programmed page.

To address one or more of the aforementioned issues, the present disclosure introduces a solution that releases the holes due to the discharge of the program voltage prior to suspending the program operation, thereby avoiding the false increase of the threshold voltage of the select memory cell and the resulting fail bit count (FBC) increase during the subsequent read operations at the programmed page. Consistent with the scope of the present disclosure, as the bit line and source line coupled to the drain and source of the select memory string (e.g., a three-dimensional (3D) NAND memory string) are grounded by turning on the DSG transistor and/or the SSG transistor of the select memory string (and the select memory cell and unselect memory cells between the select memory cell and the open DSG transistor and/or SSG transistor) during or after the program voltage discharge, the negative potential of a floating channel can be avoided, and attracted holes can be released from the channel. In some implementations, the DSG transistor and/or SSG transistor is turned on after the program discharge is finished, and a pass voltage is applied to turn on the select memory cell and unselect memory cells again when the DSG transistor and/or SSG transistor is turned on. In some implementations, the DSG transistor and/or SSG transistor is turned on while discharging the program voltage on the select word line when the select memory cell is still turned on by the discharged program voltage.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. In order to send or receive data to or from memory devices 104, host 108 can send instructions to memory system 102 besides the data.

Memory device 104 can be any memory device disclosed in the present disclosure. As disclosed below in detail, memory device 104, such as a NAND Flash memory device, can support program operation suspension triggered by an interrupt. Memory device 104 can include a memory string (e.g., a NAND memory string) having a DSG transistor, memory cells, and an SSG transistor. Consistent with the scope of the present disclosure, in response to an interrupt during a program operation on a select memory cell, memory device 104 can turn on the DSG transistor and/or the SSG transistor, and suspend the program operation afterward to avoid the false increase of the threshold voltage of the select memory cell due to holes accumulated during the suspension of the program operation. As a result, the FBC of the programmed page including the select memory cell can be reduced, and the performance of memory device 104 can be improved.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. For example, based on the instructions received from host 108, memory controller 106 may transmit various commands to memory device 104, e.g., program command, read command, erase command, etc., to control the operations of memory device 104. Consistent with the scope of the present disclosure, in some implementations, memory controller 106 transmits a program command to memory device 104 to initiate the program operation performed by memory device 104. During the ongoing program operation, an interrupt can occur, for example, from host 108, and memory controller 106 can be configured to transmit an interrupt command to memory device 104 to suspend the program operation. In some implementations, once the other operation triggered by the interrupt (e.g., a read operation on another page) is completed, memory controller 106 can be further configured to transmit a resume command to memory device 104 to resume and finish the suspended program operation.

Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MIVIC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
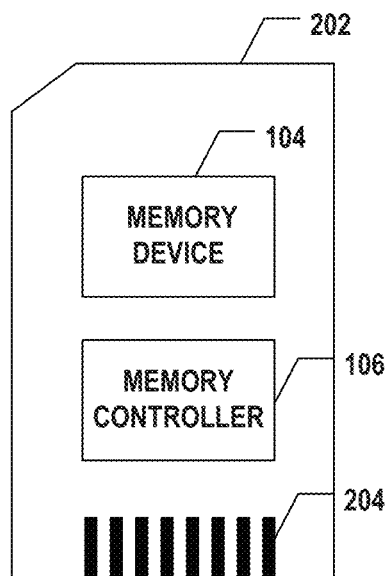
FIG. 2A illustrates a diagram of a memory card having a memory device, according to some aspects of the present disclosure.
Figure 2B:
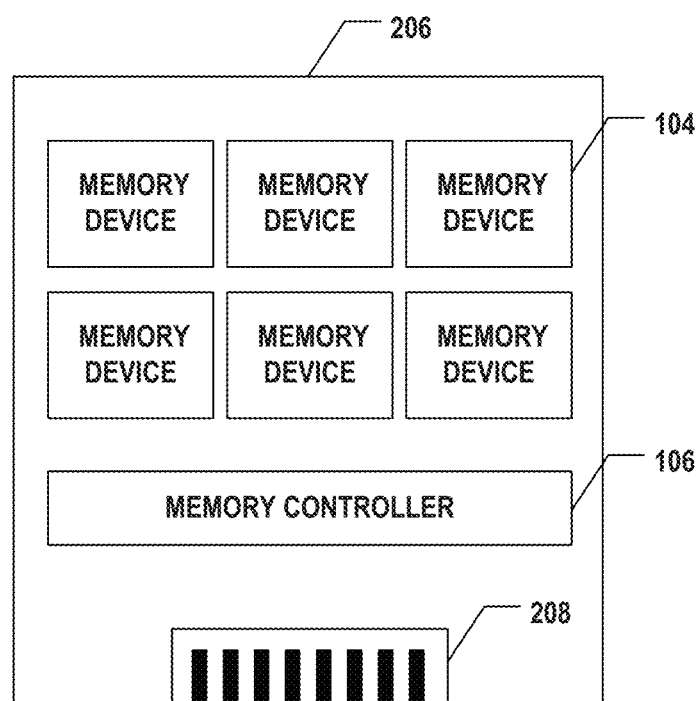
FIG. 2B illustrates a diagram of a solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 configured to couple memory card 202 to a host (e.g., host 108 in FIG. 1). In another example as shown in FIG. 2B, memory controller 106 and multiple memory devices 104 may be integrated into an SSD 206. SSD 206 can further include an SSD connector 208 configured to couple SSD 206 to a host (e.g., host 108 in FIG. 1). In some implementations, the storage capacity and/or the operation speed of SSD 206 is greater than those of memory card 202.

Figure 3:
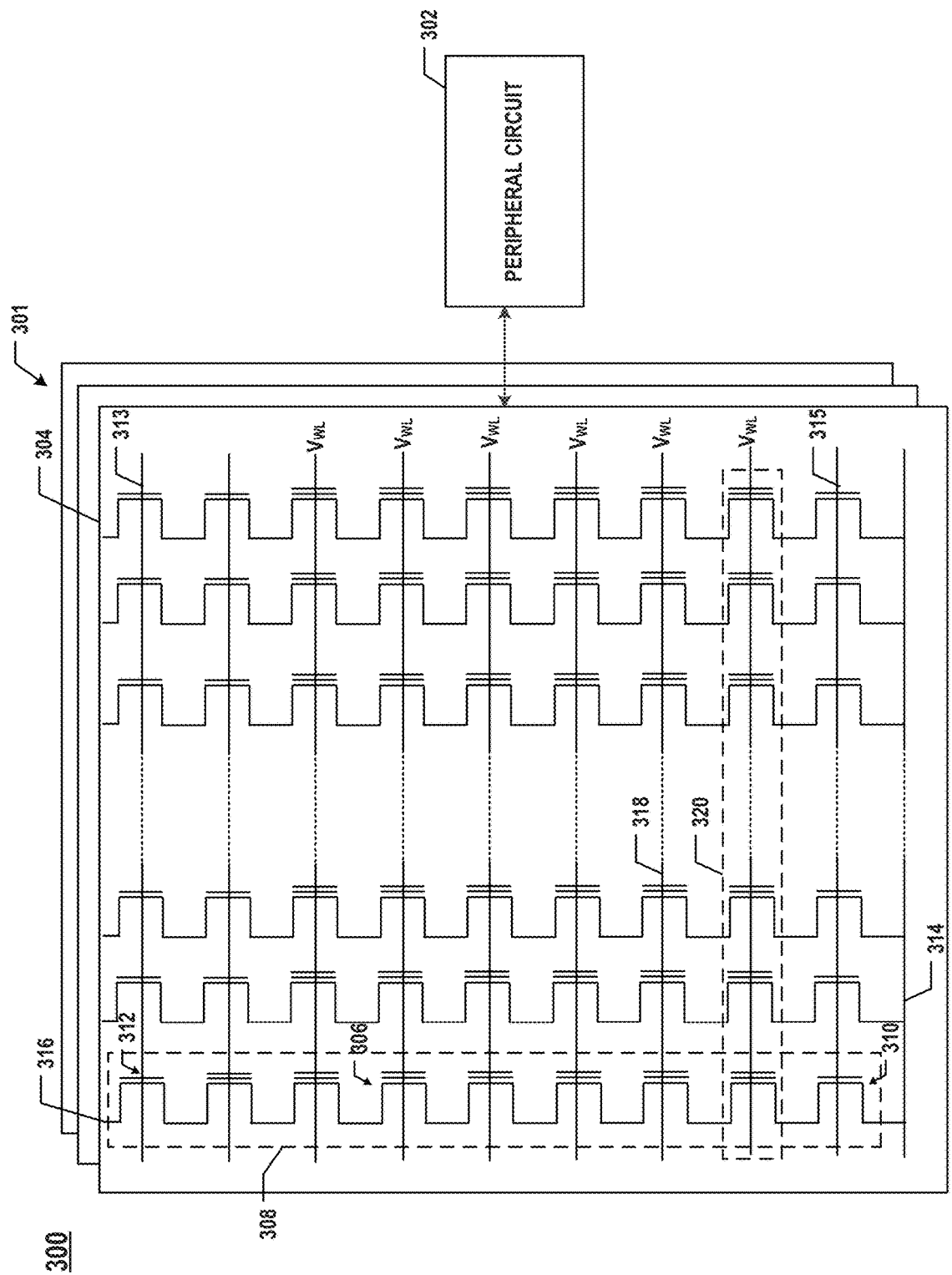
FIG. 3 illustrates a schematic diagram of a memory device including peripheral circuits, according to some aspects of the present disclosure.

FIG. 3 illustrates a schematic circuit diagram of an exemplary memory device 300 including peripheral circuits 302, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (AC S), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a DSG select voltage or a DSG unselect voltage to the gate of respective DSG transistor 312 through one or more DSG lines 313 and/or by applying an SSG select voltage or an SSG unselect voltage to the gate of respective SSG transistor 310 through one or more SSG lines 315.

As shown in FIG. 3, NAND memory strings 308 can be organized into multiple blocks 304, each of which can have a common source line 314, e.g., coupled to an ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program and read operations. The size of one page 320 in bits can relate to the number of NAND memory strings 308 coupled by word line 318 in one block 304. Each word line 318 can include a plurality of control gates (gate electrodes) at each memory cell 306 on respective page 320 and a gate line coupling the control gates.

Figure 4A:
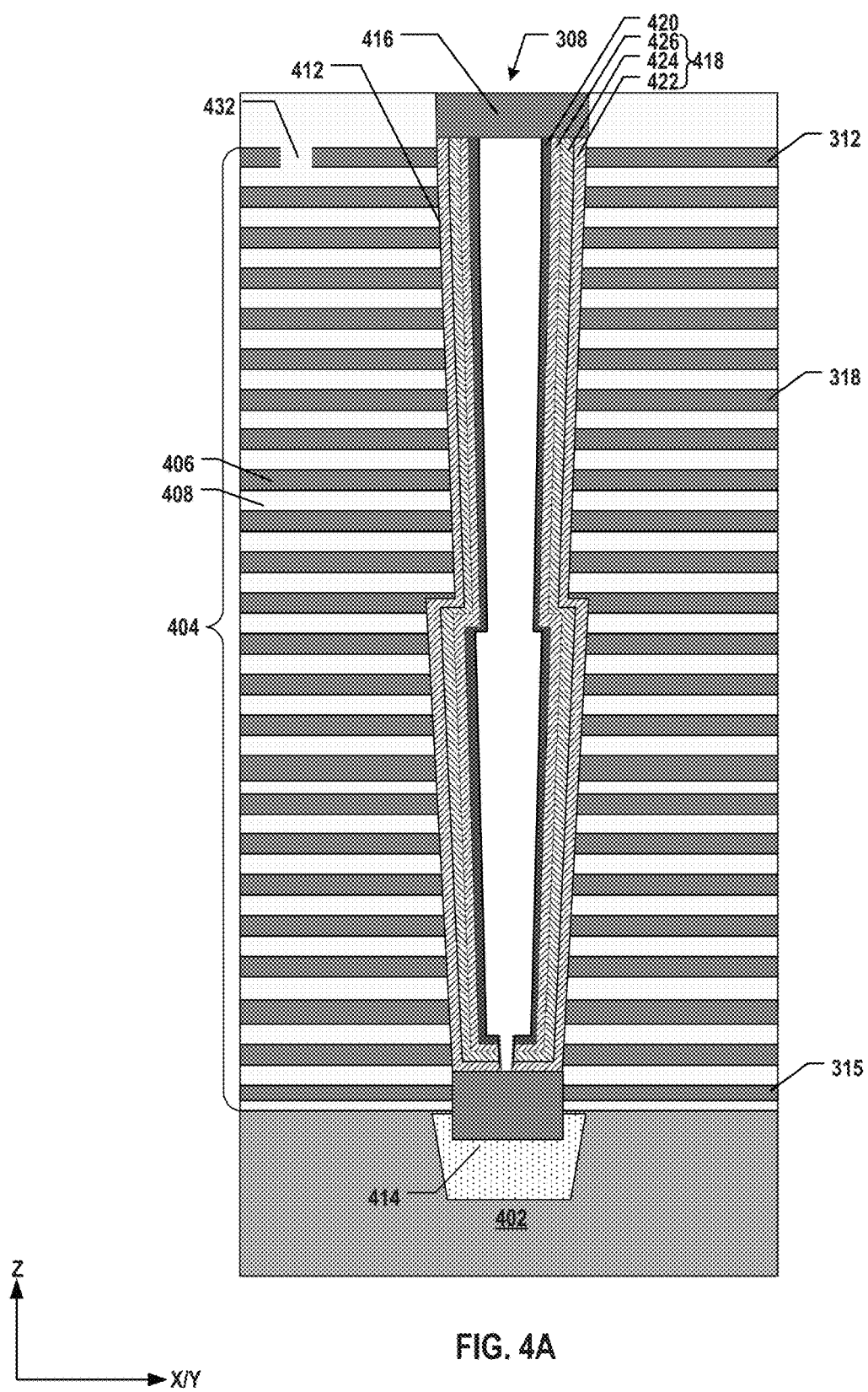
FIGS. 4A and 4B illustrate a side view and a plan view of cross-sections of a memory cell array including a NAND memory string, respectively, according to some aspects of the present disclosure.
Figure 4B:
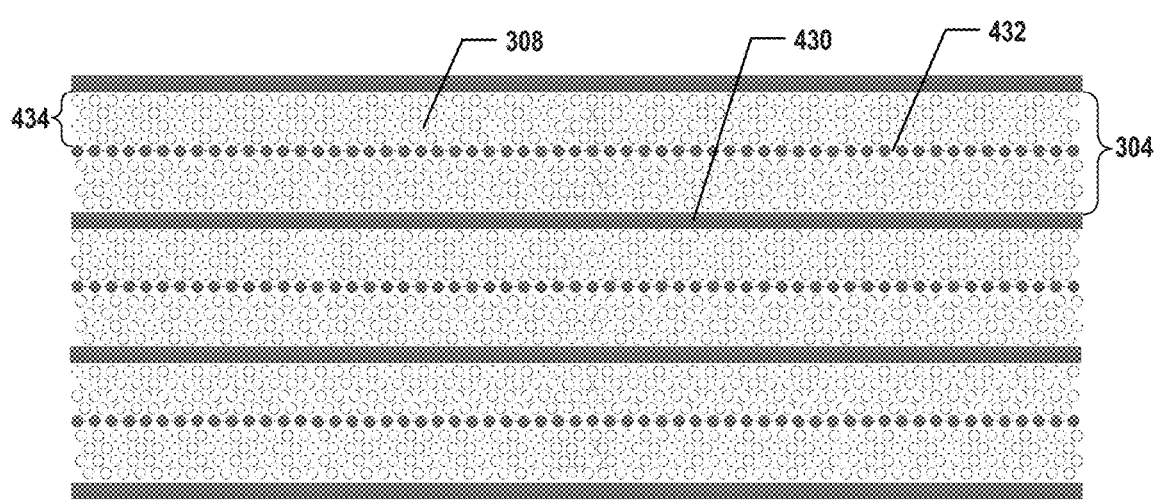

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include the control gates of memory cells 306, the gates of DSG transistors 312, or the gates of SSG transistors 310, and can extend laterally as DSG line 313 in the upper portion of memory stack 404, SSG line 315 in the lower portion of memory stack 404, or word line 318 between DSG line 313 and SSG line 315. It is understood that although one SSG line 315 and one DSG line 313 are shown in FIG. 4A, the number of SSG lines 315 and the number of DSG lines 313 (as well as the numbers of SSG transistors 310 and DSG transistors 312 coupled to the SSG lines 315 and DSG lines 313, respectively) may vary in other examples.

As shown in FIG. 4A, NAND memory string 308 includes a channel structure 412 extending vertically through memory stack 404. In some implementations, channel structure 412 includes a channel opening filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source of NAND memory string 308 is in contact with well 414, according to some implementations. For example, source line 314 may be coupled to well 414 to apply an erase voltage to well 414, i.e., the source of NAND memory string 308, during erase operations. As described above, during and after discharging the program voltage in a program operation in response to an interrupt, holes may be attracted from well 414 (e.g., P-well) and accumulated in semiconductor channel 420 and storage layer 424 due to a negative potential coupled in semiconductor channel 420. In some implementations, NAND memory string 308 further includes a channel plug 416 at the drain end of NAND memory string 308, e.g., as part of the drain of NAND memory string 308.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In one example, each slit structure 430 may extend along the x-direction (e.g., the word line direction), and multiple blocks 304 may be arranged along the y-direction (e.g., the bit line direction). In some implementations, each block 304 can be further divided into smaller areas (e.g., fingers 434) by DSG cuts 432, which electrically separate DSG lines 313 between adjacent fingers 434, such that DSG lines 313 in different fingers 434 may be individually controlled in read and program operations.

Figure 5:
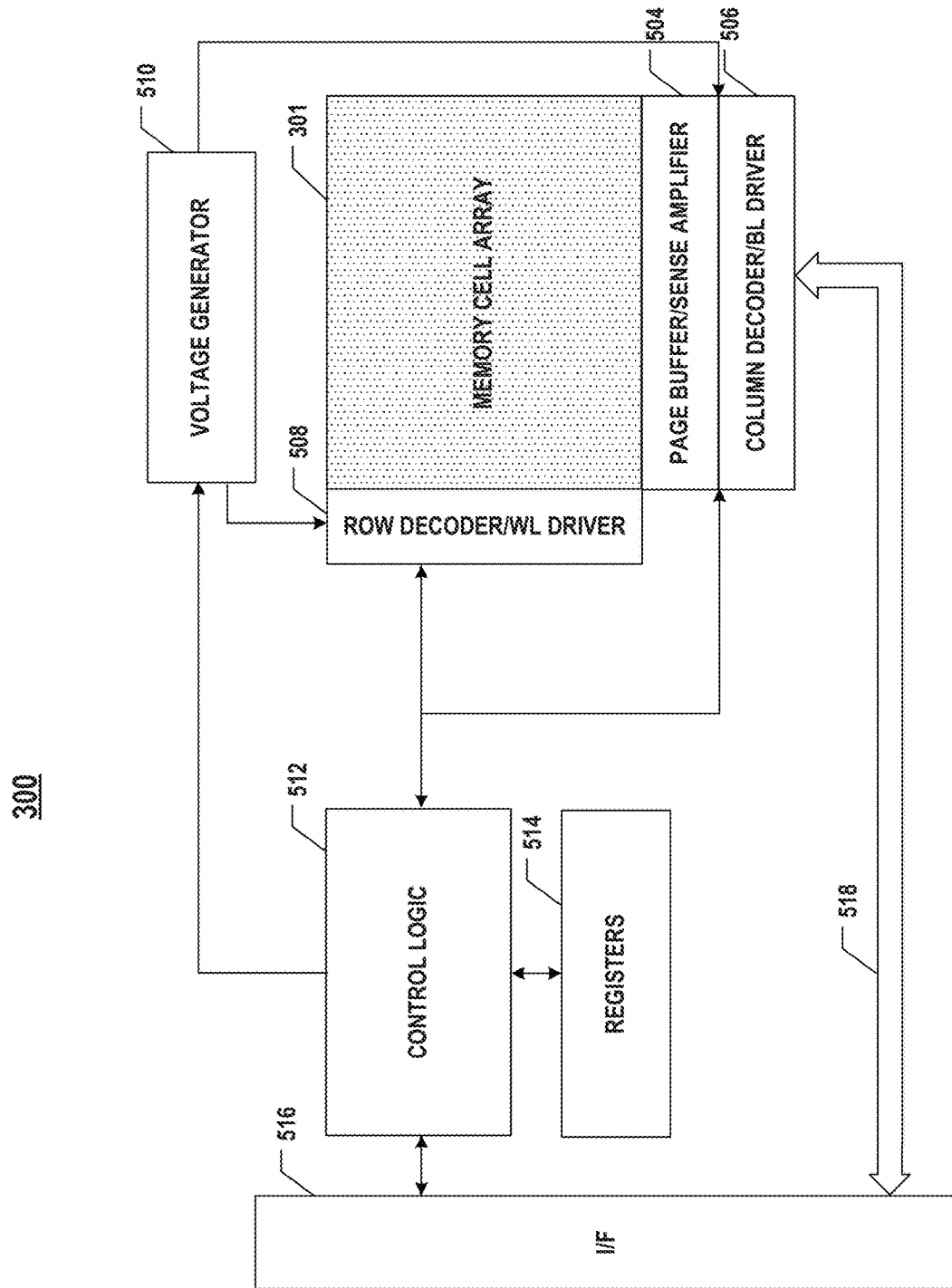
FIG. 5 illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target (select) memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into select memory cells 306 coupled to select word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled according to the control signals by control logic 512 and select/unselect blocks 304 of memory cell array 301 and select/unselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315, and DSG lines 313 as well using SSG voltages and DSG voltages generated from voltage generator 510.

Voltage generator 510 can be configured to be controlled by control logic 512 and generate the various word line voltages (e.g., read voltage, program voltage, pass voltage, verification voltage), SSG voltages (e.g., select/unselect voltages), DSG voltages (e.g., select/unselect voltages), bit line voltages (e.g., ground voltage), and source line voltages (e.g., ground voltage) to be supplied to memory cell array 301, as described below in detail.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit.

In some implementations, control logic 512 can receive a program command issued by a memory controller (e.g., memory controller 106 in FIG. 1) and send control signals to various peripheral circuits, such as row decoder/word line driver 508, column decoder/bit line driver 506, and voltage generator 510 to initiate the program operation on select memory cells 306 coupled to select word line 318. Consistent with the scope of the present disclosure, in response to receiving an interrupt command issued by the memory controller during the ongoing program operation, control logic 512 can send control signals to at least row decoder/word line driver 508 to turn on DSG transistors 312 and/or SSG transistors 310 of NAND memory strings 308 in order to avoid the accumulation of holes in semiconductor channels 420 of NAND memory strings 308 due to the negative coupling potential in semiconductor channels 420 of NAND memory strings 308. Control logic 512 can then send control signals to various peripheral circuits, such as row decoder/word line driver 508, column decoder/bit line driver 506, and voltage generator 510, to suspend the program operation and initiate another operation triggered by the interrupt command (e.g., a read operation on another page). In some implementations, registers 514 are configured to store the information of the suspended program operation, such as the programming page, the program pass, and the program/verify cycle at which the program operation is suspended, etc., which is necessary for resuming the suspended program operation. In some implementations, control logic 512 is configured to check the status of the other operation from status registers of registers 514. In response to completion of the other operation (e.g., read operation), control logic 512 is further configured to retrieve the information of the suspended program operation stored in registers 514 and send control signals to various peripheral circuits, such as row decoder/word line driver 508, column decoder/bit line driver 506, and voltage generator 510 to resume the suspended read operation based on the retrieved information from registers 514, according to some implementations.

Interface 516 can be coupled to control logic 512 and act as a control buffer to buffer and relay control commands received from a memory controller (e.g., memory controller 106 in FIG. 1) to control logic 512 and status information received from control logic 512 to the memory controller. Interface 516 can also be coupled to column decoder/bit line driver 506 via data bus 518 and act as a data input/output (I/O) interface and a data buffer to buffer and relay the data to and from memory cell array 301.

Figure 6:
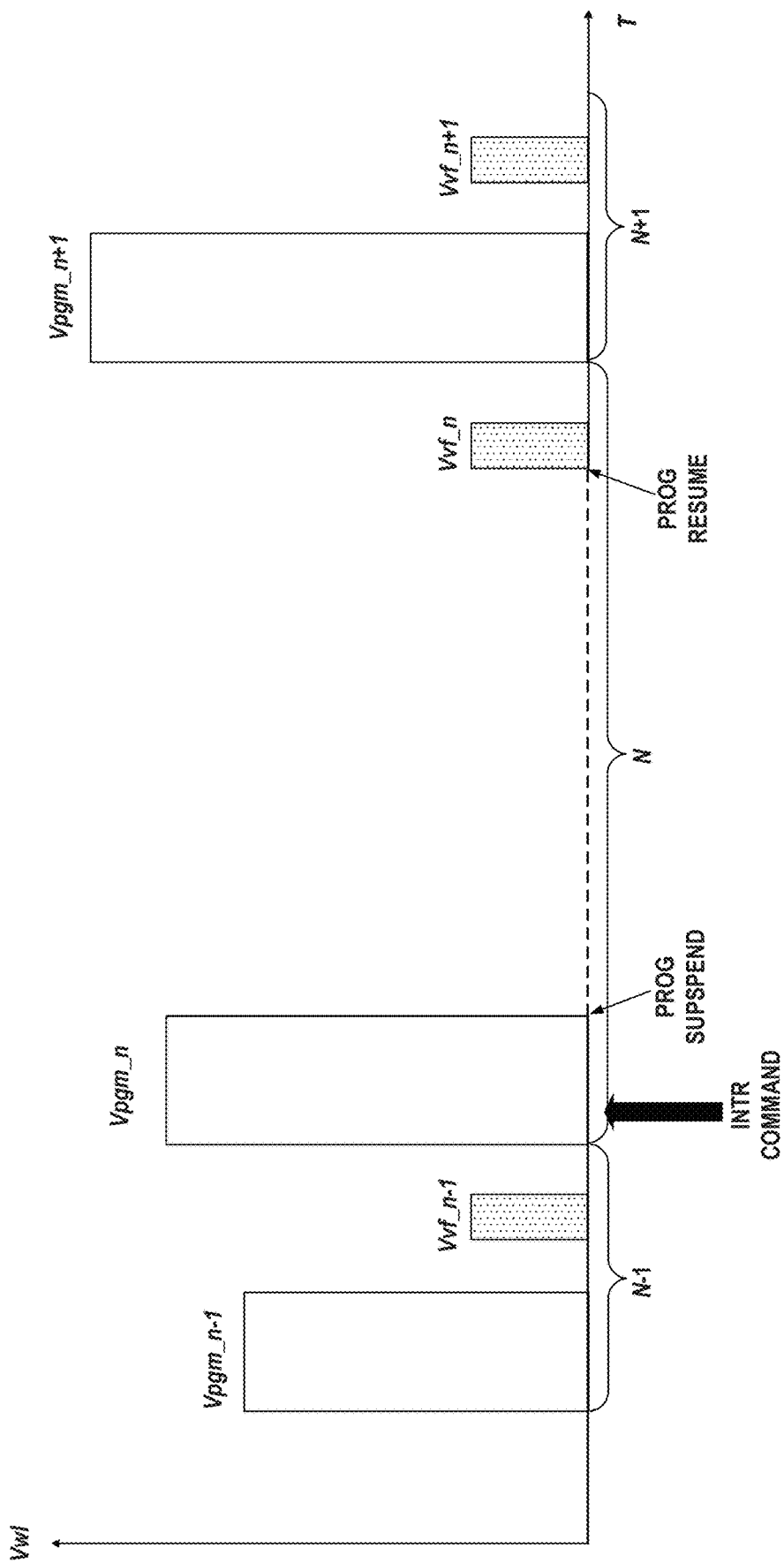
FIG. 6 illustrates a scheme of a program operation suspended in response to an interrupt.
Figure 7:
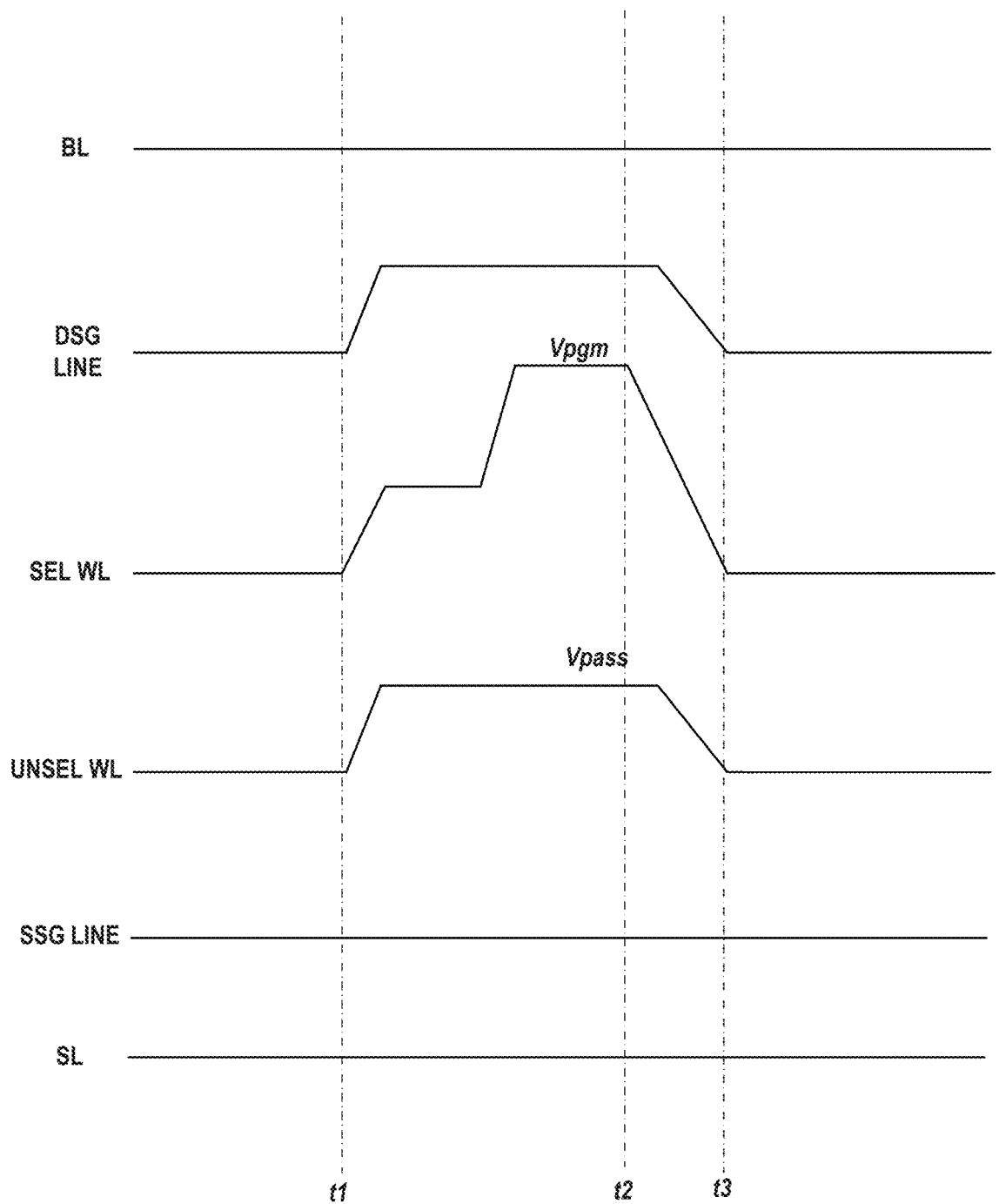
FIG. 7 illustrates a waveform diagram of the program operation scheme in FIG. 6.

FIG. 6 illustrates a scheme of a program operation suspended in response to an interrupt. FIG. 7 illustrates a waveform diagram of the program operation scheme in FIG. 6. As shown in FIG. 6, to program the select memory cells coupled to a select word line, one or more program/verify cycles (N−1, N, N+1, . . . ) are included in the program operation in sequence. During the program operation, in any program/verify cycle, a program voltage (e.g., Vpgm_n−1, Vpgm_n, or Vpgm_n+1) is applied to the select word line to program the select memory cells coupled to the select word line, followed by applying a verify voltage (e.g., Vvf_n−1, Vvf_n, or Vvf_n+1) to check whether the threshold voltage of each programmed memory cell reaches the verify voltage. If one or more memory cells (verification-failed memory cells) fail to pass the verification, i.e., their threshold voltages are below the verify voltage, a subsequent program/verify cycle is then applied on the verification-failed memory cells with an increased program voltage.

When an interrupt, for example, an instruction from a host to perform a read operation, occurs during the program operation, an interrupt command is issued to suspend the program operation. As shown in FIG. 6, when the interrupt command is issued while applying the program voltage (Vpgm_n), the program operation is suspended without applying the verify voltage (Vvf_n) in the same program/verify cycle once the program voltage is fully discharged. The program operation then enters into a suspended state (represented in the dashed line) until the other operation triggered by the interrupt is finished. Once the program operation is resumed, the corresponding verify voltage in the same program/verify cycle is applied to finish this extended program/verify cycle. The duration of the suspended state depends on the duration of the other operation triggered by the interrupt, according to some implementations.

For example, as shown in FIG. 7, a program voltage (Vpgm) for programming select memory cells is first ramped up and applied to the select word line (SEL WL) between time t1 and time t2 during which the interrupt command is received, and the program voltage is discharged and ramped down between time t2 and time t3. After time t2, the program operation enters into the suspended state in which the word line voltage applied on the select word line turns off the select memory cells (e.g., a ground voltage (0 V) or a supply voltage Vdd (1.3 V) that is below the threshold voltage of the select memory cells). Similarly, on each unselect word line (UNSEL WL), a pass voltage (Vpass) that turns on the unselect memory cells is ramped up and applied from time t2 and discharged to the word line voltage that turns off the unselect memory cells until time t3, which is maintained afterward. The voltages applied to the DSG line coupled to select memory strings follow the same waveform as those applied to the unselect word line. The voltages applied to the SSG line is kept at an unselect voltage that always turns on the SSG transistor between time t1 and time t3 as well as in the suspended state. The bit line and the source line are grounded between time t1 and time t3 as well as in the suspended state, such that the source and the drain of each memory string is grounded.

Figure 8:
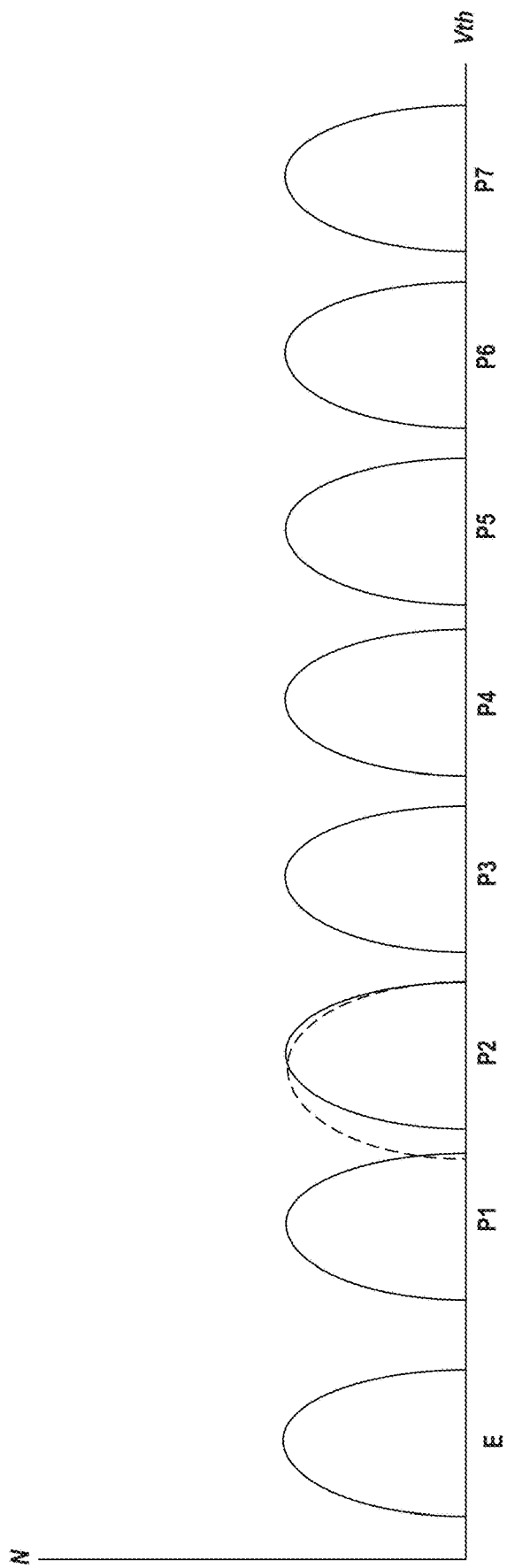
FIG. 8 illustrates the threshold voltage distributions of memory cells after the program operation in FIG. 6.
Figure 9:
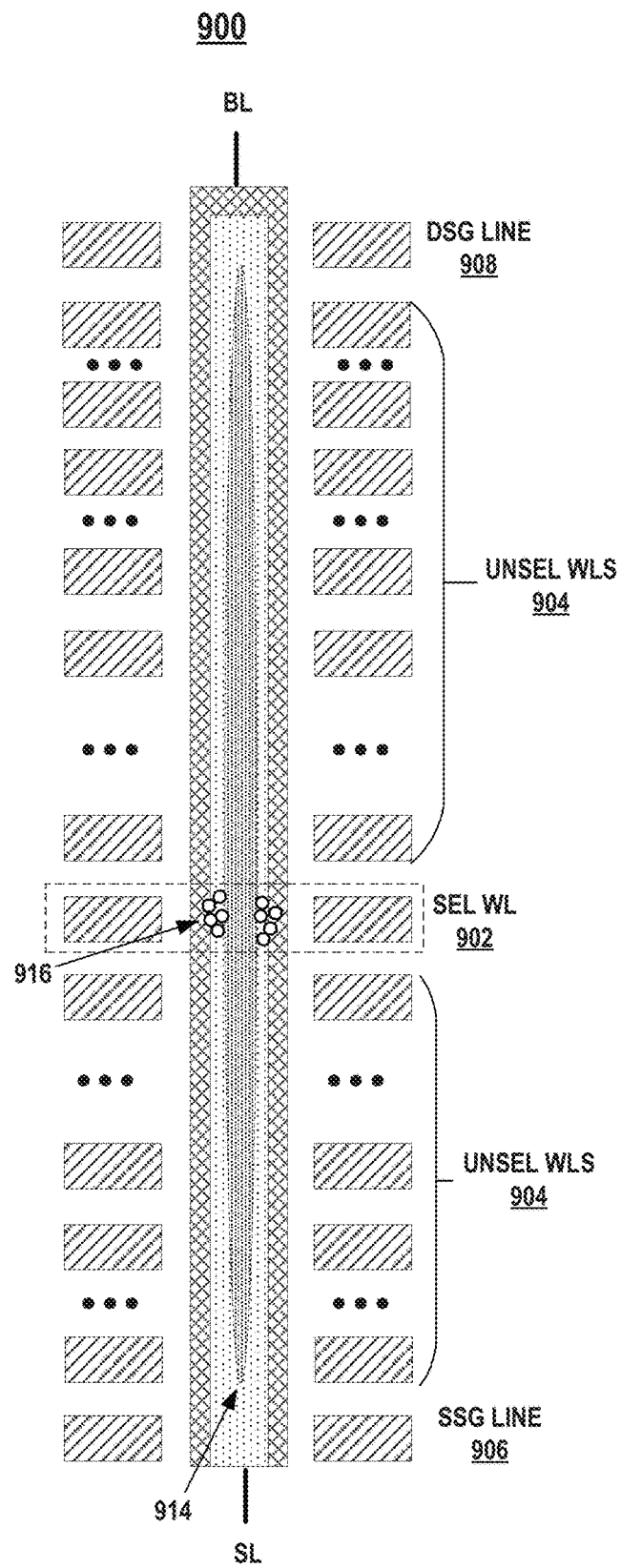
FIG. 9 illustrates a 3D NAND memory string in a program operation suspended in response to an interrupt command, according to some aspects of the present disclosure.

Referring to FIG. 9, when a 3D NAND memory string 900 (e.g., an example of NAND memory string 308) performs write operation suspended in response to an interrupt command following the scheme and waveform described above with respect to FIGS. 7 and 8, during the suspended state, because the DSG transistors and SSG transistor at the respective drain end and source end thereof are turned off by the unselect voltages applied to a DSG line 908 and an SSG line 906, respectively, the channel (e.g., corresponding to semiconductor channel 420 of NAND memory string 308) of 3D NAND memory string 900 is floating. Parasitic capacitors are formed between 3D NAND memory string 900 and each select or unselect word line 902 or 904. Thus, the discharging of the program voltage on a select word line 902 as well as the discharging of the pass voltage on each unselect word line 904 form a negative channel coupling potential 914 in the channel of 3D NAND memory string 900 during the suspended state, which attracts and accumulates holes 916 (e.g., from P-well 414 coupled to the source of 3D NAND memory string 900). Holes 916 accumulate in the channel and the charge trap layer (e.g., corresponding charge trap layer 424 of NAND memory string 308) can increase the threshold voltage of select memory cells (represented in the dashed box) that has been programmed by the program voltage, thereby helping the select memory cells to pass the verification once the program operation is resumed.

For example, FIG. 8 illustrates the threshold voltage (Vth) distributions of memory cells after the program operation in FIG. 6. The program operation programs the memory cells into 8 states including 1 erase state (E) and 7 program states (P1 to P7). Assuming the select memory cells with accumulated holes 916 shown in FIG. 9 due to program operation suspension are programmed to the $2^{nd}$ program state (P2). Holes 916 can be released from 3D NAND memory string 900 after the program state and cause the threshold voltage distributions of the select memory cells at the $2^{nd}$ program state to shift negative, as represented by the dashed line in FIG. 8. In case the shifted threshold voltage distribution overlaps with the $1^{st}$ program state, FBC increases when reading the select memory cells at the $2^{nd}$ program state. As a result, the scheme and waveform of program operation in response to an interrupt described above with respect to FIGS. 6 and 7 are undesirable as they can increase the FBC in subsequent read operations and affect the performance of the memory device implementing such a scheme and waveform.

Figure 10:
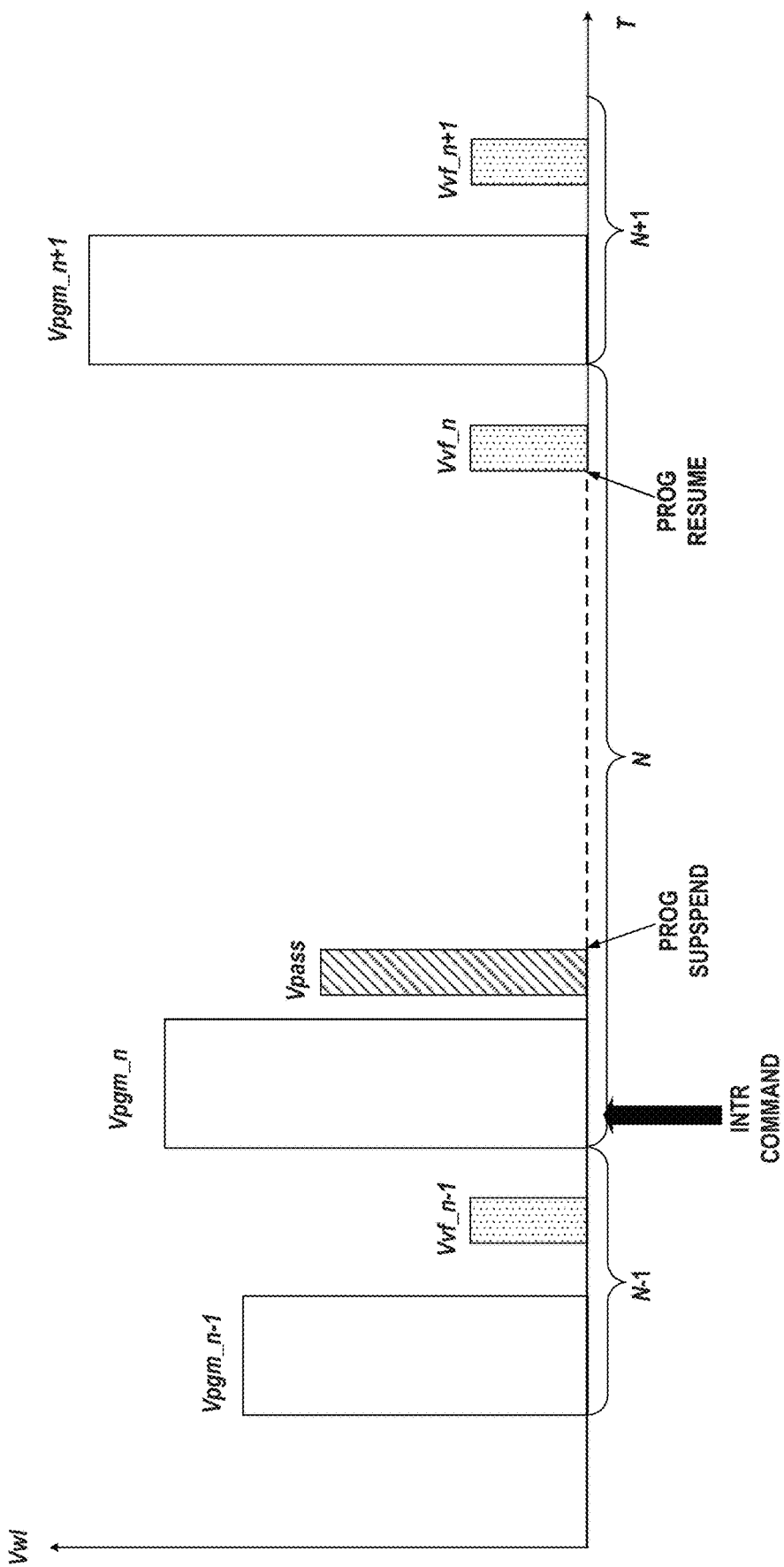
FIG. 10 illustrates a scheme of a program operation suspended in response to an interrupt command, according to some aspects of the present disclosure.
Figure 11:
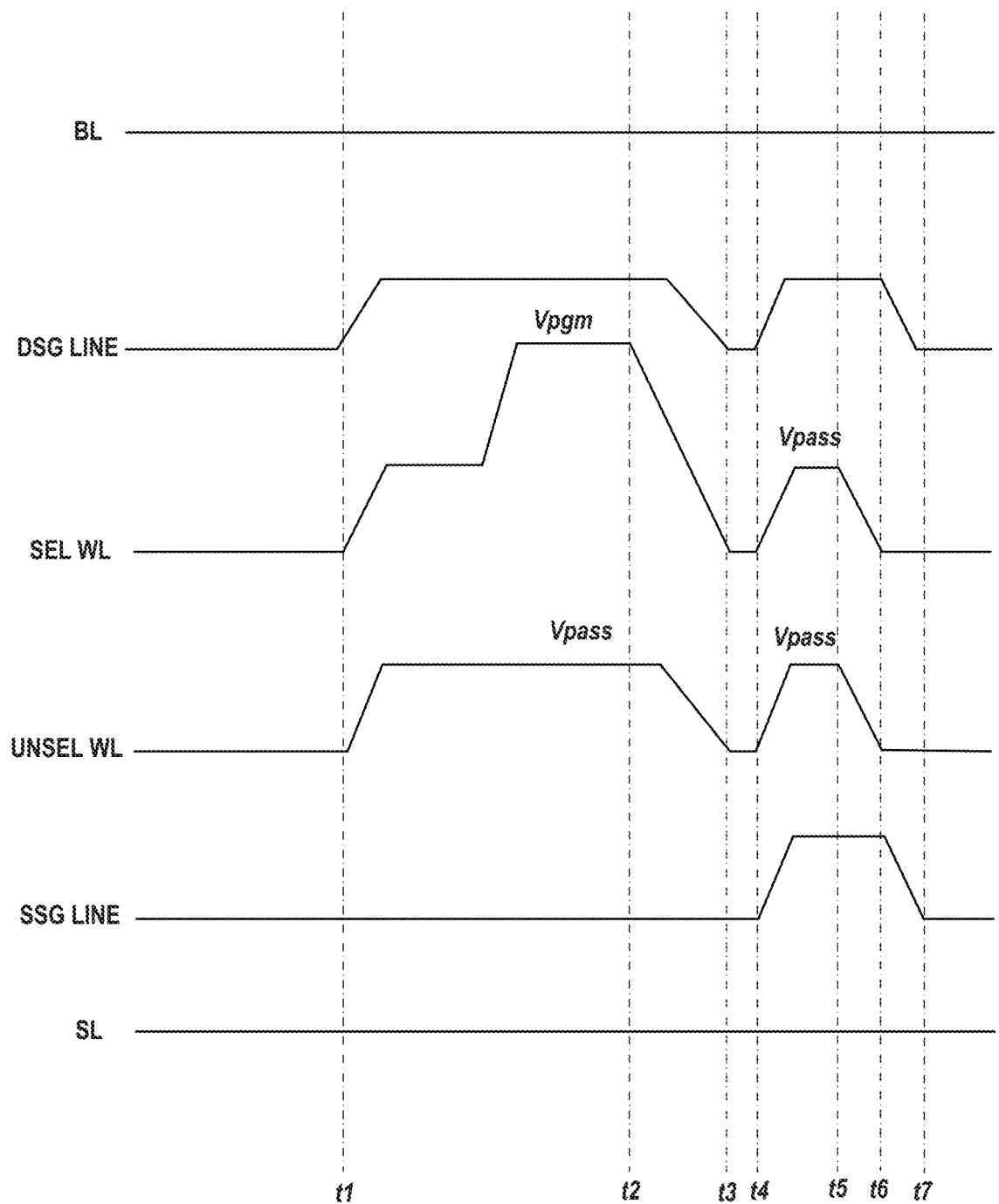
FIG. 11 illustrates a waveform diagram of the program operation scheme in FIG. 10, according to some aspects of the present disclosure.
Figure 12:
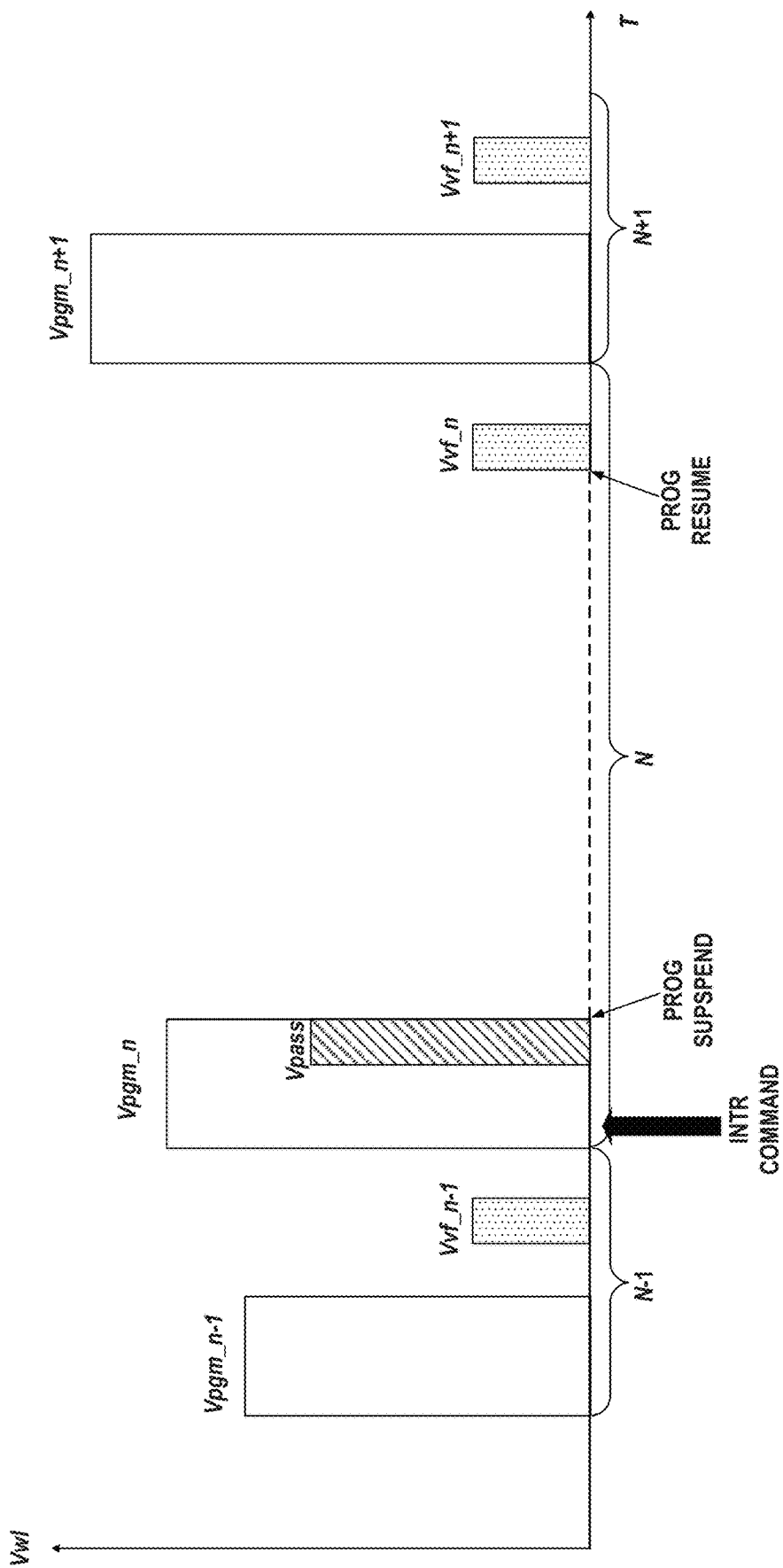
FIG. 12 illustrates another scheme of a program operation suspended in response to an interrupt command, according to some aspects of the present disclosure.
Figure 13:
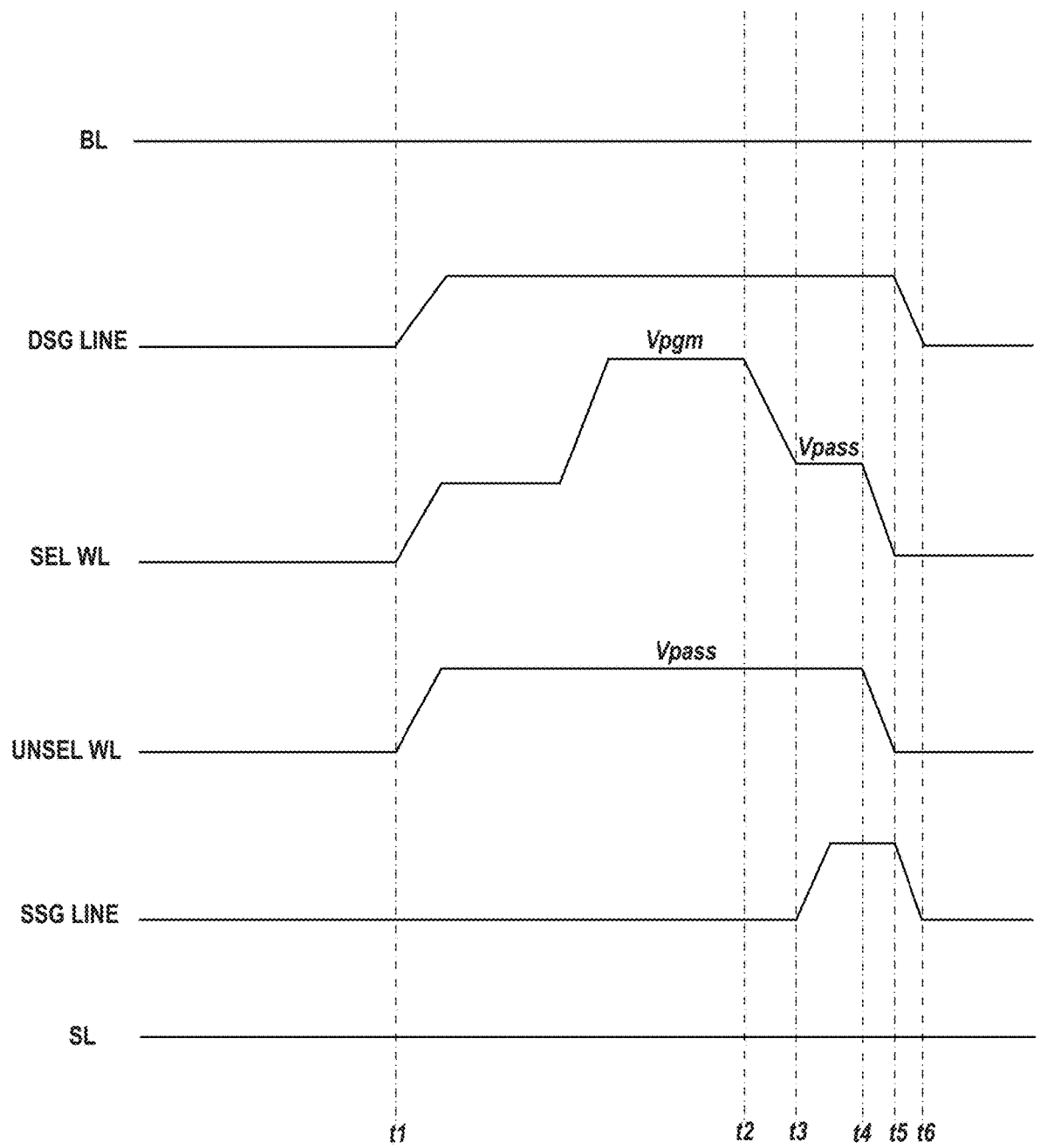
FIG. 13 illustrates a waveform diagram of the program operation scheme in FIG. 12, according to some aspects of the present disclosure.

Consistent with the scope of the present disclosure, the hole accumulation due to negative channel coupling potential can be avoided by turning on the DSG transistor and/or SSG transistor of the memory string prior to entering the suspended state, thereby reducing the FBC and improving the performance of the memory device. As described above, the hole accumulation is caused by negative coupling channel potential occurred when both the DSG transistor and SSG transistors at both ends of a NAND memory string is turned off during and/or after the discharging of program voltage and pass voltage on the word lines. Thus, by turning on at least one of the DSG transistor and SSG transistor, the negative coupling channel potential can be broken. Moreover, since both the source and drain of the NAND memory string are grounded when the channel of the NAND memory string is open (e.g., by turning on DSG transistor and/or SSG transistor and memory cells therebetween), any accumulated holes can be released from the channel to the ground. The various schemes of program operations in response to an interrupt are described below in detail. The various schemes can be implemented by memory device 300 described above with respect to FIGS. 3, 4A, 4B, and 5. In one example, FIG. 10 illustrates a scheme of a program operation suspended in response to an interrupt command, according to some aspects of the present disclosure, and FIG. 11 illustrates a waveform diagram of the program operation scheme in FIG. 10, according to some aspects of the present disclosure. In another example, FIG. 12 illustrates another scheme of a program operation suspended in response to an interrupt command, according to some aspects of the present disclosure, and FIG. 13 illustrates a waveform diagram of the program operation scheme in FIG. 12, according to some aspects of the present disclosure.

As shown in FIGS. 3, 4A, and 5, control logic 512 of peripheral circuits 302 can be configured to initiate a program operation on a select memory cell 306 of a NAND memory string 308. In some implementations, control logic 512 receives a program command from a memory controller (e.g., memory controller 106) through interface 516, and in response, sends control signals to at least row decoder/word line driver 508, column decoder/bit line driver 506, and voltage generator 510 to initiate the program operation on select memory cell 306 coupled to select word line 318. Depending on the number of states to be programmed (i.e., the number of bits in each memory cell 306, e.g., SLC, MLC, TLC, QLC, etc.), one or more program passes can be performed. As shown in FIG. 10, in each program pass, one or more program/verify cycles (e.g., N−1, N, N+1, . . . ) can be included in the program operation in sequence. During the program operation, in any program/verify cycle, a program voltage (i.e., a voltage pulse signal, a.k.a., a program pulse, e.g., Vpgm_n−1, Vpgm_n, or Vpgm_n+1) is applied to select word line 318 by word line driver 508 to program select memory cell 306 coupled to select word line 318. As shown in FIG. 11, between time t1 and time t2, word line driver 508 can be configured to apply a program voltage (Vpgm, e.g., 20 V) on the select word line 318 to program select memory cell 306. In some implementations, word line driver 508 ramps up the positive bias program voltage until it reaches a level that is not only greater than the threshold voltage of select memory cell 306 to turn on select memory cell 306, but also greater enough to increase the threshed voltage of select memory cell 306 to a desired level of the program state.

Besides applying the program voltage on select word line 318, word line driver 508 can also be configured to apply appropriate voltage signals on other lines coupled to NAND memory string 308. As shown in FIG. 11, between time t1 and time t2, word line driver 508 can be configured to apply a pass voltage (Vpass, e.g., 10 V) on each unselect word line 318 to turn on unselect memory cells 306 while applying the program voltage on select word line 318. In some implementations, the positive bias pass voltage is smaller than the program voltage, but still greater than the threshold voltage of unselect memory cells 306. Similarly, between time t1 and time t2, word line driver 508 can be further configured to apply a DSG select voltage to DSG line 313 to turn on DSG transistor 312 while applying the program voltage on select word line 318. In some implementations, the positive bias DSG select voltage is smaller than the program voltage, but still greater than the threshold voltage of DSG transistor 312. In contrast, between time t1 and time t2, word line driver 508 can be further configured to apply an SSG unselect voltage to SSG line 315 to turn off SSG transistor 310. In some implementations, the SSG unselect voltage is a ground voltage (0 V) or a supply voltage Vdd (e.g., 1.3 V) that is below the threshold voltage of SSG transistor 310. As shown in FIG. 11, both bit line 316 and source line 314 can be grounded, for example, having a ground voltage (0 V) thereon.

Referring back to FIGS. 3, 4A, and 5, during the ongoing program operation, control logic 512 of peripheral circuits 302 can be configured to receive an interrupt command, for example, from a memory controller (e.g., memory controller 106 in FIG. 1). The interrupt command is issued by the memory controller when an interrupt occurs, according to some implementations. The interrupt can be any request by a host (e.g., host 108 in FIG. 1) that needs to interrupt the ongoing program operation performed by memory device 300, so that the event can be processed in a timely manner. For example, a read operation may need to be performed on another page 320 of memory cell array 301 immediately before the completion of the currently performed program operation. It is understood that any suitable interrupt event may trigger the microcontroller to transmit an interrupt command to control logic 512 of peripheral circuits 302 to suspend the ongoing program operation in order to perform another operation, e.g., a read operation, first. In some implementations, the interrupt occurs while applying the program voltage on select word line 318. That is, control logic 512 of peripheral circuits 302 receives the interrupt command when word line driver 508 applies the program voltage on select word line 318, e.g., between time t1 and time t2, as shown in FIG. 11, according to some implementations. It is understood that the interrupt (and the receipt of the interrupt command) may occur in any program/verify cycle (including the first cycle, the last cycle, or any intermediate cycles) or in a single program/verify cycle.

Different from the existing program suspension scheme described above in FIGS. 6 and 7, to avoid negative channel coupling potential and holes accumulation, in response to the interrupt (e.g., by receiving the interrupt command), peripheral circuits 302 can be configured to turn on at least one of DSG transistor 312 or SSG transistor 310 prior to suspending the program operation; while turning on at least DSG transistor 312 or SSG transistor 310, peripheral circuits 302 can also be configured to turn on select memory cell 306, and each unselect memory cell 306 between select memory cell 306 and at least DSG transistor 312 or SSG transistor 310. In other words, a "clean" process that can break the negative channel coupling potential and/or release the accumulated holes may be performed prior to the program suspension state. In some implementations, control logic 512 of peripheral circuits 302 sends control signals to at least row decoder/word line driver 508, column decoder/bit line driver 506, and voltage generator 510 to perform the clean process as described below in detail.

According to some aspects of the present disclosure, as shown in FIGS. 10 and 11, the clean process can be performed after the completion of the program pulse, i.e., after the discharging of the program voltage (Vpgm) on select word line 318. A pass voltage (Vpass) that is smaller than the program voltage can be applied on select word line 318 to turn on select memory cell 306 again after discharging the program voltage on select word line 318. As shown in FIG. 11, word line driver 508 can be configured to discharge the program voltage (Vpgm) on select word line 318 between time t2 and time t3, such that the word line voltage (e.g., a ground voltage (0 V) or a supply voltage (e.g., 1.3V)) applied on select word line 318 between time t3 and time t4 is below the threshold voltage of select memory cell 306. Thus, select memory cell 306 can be turned off between time t3 and time t4. Similarly, word line driver 508 can be configured to discharge the pass voltage (Vpass) on each unselect word line 318 between time t2 and time t3, such that the word line voltage (e.g., a ground voltage (0 V) or a supply voltage (e.g., 1.3V)) applied on unselect word line 318 between time t3 and time t4 is below the threshold voltage of select memory cell 306. Thus, unselect memory cell 306 can be turned off between time t3 and time t4. Likewise, word line driver 508 can be configured to discharge the DSG select voltage on DSG line 313 between time t2 and time t3, such that a DSG unselect voltage (e.g., a ground voltage (0 V) or a supply voltage (e.g., 1.3V)) applied on DSG line 313 between time t3 and time t4 is below the threshold voltage of DSG transistor 312. Thus, DSG transistor 312 can be turned off between time t3 and time t4. Word line driver 508 can be further configured to maintain the SSG unselect voltage (e.g., a ground voltage (0 V) or a supply voltage (e.g., 1.3V)) on SSG line 315 to keep turning off SSG transistor 310 between time t3 and time t4.

Different from the scheme and waveform described above in FIGS. 6 and 7 in which the voltage levels between time t3 and time t4 (i.e., after discharging of the program voltage on select word line 318) are maintained during the program suspended state, word line driver 508 can be configured to apply a pass voltage (Vpass) on select word line 318 to turn on select memory cell 306 again between time t4 and time t6, i.e., after discharging the program voltage on select word line 318. In some implementations, the pass voltage is greater than the threshold voltage of select memory cell 306 to turn on select memory cell 306 again, but on the other hand, is smaller than the program voltage (Vpgm) in order not to program select memory cell 306 again. For example, the pass voltage applied on select word line 318 between time t4 and time t6 may be the same as or different from the pass voltage applied on unselect word line 318 between time t1 and time t3 as long as it can turn on select memory cell 306 again without re-programing it. Similarly, word line driver 508 can also be configured to apply a pass voltage (Vpass) on each unselect word line 318 to turn on unselect memory cell 306 again between time t4 and time t6, i.e., after discharging the pass voltage on unselect word line 318.

As shown in FIG. 11, word line driver 508 can be further configured to apply an SSG select voltage that is greater than the threshold voltage of SSG transistor 310 on SSG line 315 to turn on SSG transistor 310 while applying the pass voltage on select word line 318, for example, between time t4 and time t6. In some implementations, SSG transistor 310 remains on for a while, e.g., between time t6 and t7, after turning off select memory cell 306. Likewise, word line driver 508 can be further configured to apply a DSG select voltage that is greater than the threshold voltage of DSG transistor 312 on DSG line 313 to turn on DSG transistor 312 again while applying the pass voltage on select word line 318, for example, between time t4 and time t6. In some implementations, DSG transistor 312 remains on for a while, e.g., between time t6 and t7, after turning off select memory cell 306.

As a result, during the time between t4 and time t6, the channel (e.g., semiconductor channel 420) of NAND memory string 308 is open as each of DSG transistor 312, memory cells 306, and SSG transistor 310 is turned on, thereby breaking the negative channel coupling potential (e.g., negative channel coupling potential 914 in FIG. 9) coupled in the channel. Moreover, the open channel of NAND memory string 308 can release any accumulated holes (e.g., holes 916 in FIG. 9) from the source and drain of NAND memory string 308, which are grounded through source line 314 and bit line 316, respectively. Although both DSG transistor 312 and SSG transistor 310 are turned on according to the waveform shown in FIG. 11, since both the source and drain of NAND memory string 308 are grounded, it is understood that in some examples, turning on one of DSG transistor 312 and SSG transistor 310 may also break the negative channel coupling potential and release the accumulated holes from the channel. Accordingly, only unselect memory cells 306 between select memory cell 306 and the DSG transistor 312 and SSG transistor 310 that is turned on may be turned on to form a path for the holes accumulated at select memory cell 306 to release. Nevertheless, turning on both DSG transistor 312 and SSG transistor 310, as well as each unselect memory cell 306 may facilitate the release of the accumulated holes, for example, with a shorter period between t4 and time t7.

According to some aspects of the present disclosure, as shown in FIGS. 12 and 13, the clean process can be performed prior to the completion of the program pulse, i.e., during the discharging of the program voltage (Vpgm) on select word line 318. While discharging the program voltage on select word line 318 and when the discharged program voltage (e.g., pass voltage (Vpass)) still turns on select memory cell 306, DSG transistor 312 and/or SSG transistor 310 can be turned on. In other words, as shown in FIG. 12, the clean process (e.g., represent by Vpass) may be merged with the program process (e.g., represented by Vpgm_n) to reduce the required time period compared with the scheme described above with respect to FIGS. 10 and 11. As shown in FIG. 13, word line driver 508 can be configured to discharge the program voltage (Vpgm) on select word line 318 between time t2 and time t5, such that the word line voltage (e.g., a ground voltage (0 V) or a supply voltage (e.g., 1.3V)) applied on select word line 318 after time t5 is below the threshold voltage of select memory cell 306. Instead of applying the SSG select voltage on SSG line 315 after time t5, i.e., after the completion of discharge the program voltage on select word line 318, word line driver 508 can be configured to apply the SSG select voltage that is greater than the threshold voltage of SSG transistor 310 on SSG line 315 to turn on SSG transistor 310 while discharging the program voltage on select word line 318, e.g., between time t3 and time t5. As shown in FIG. 11, DSG transistor 312 and each unselect memory cell 306 can be turned on as well while discharging the program voltage on select word line 318, e.g., between time t3 and time t5. In some implementations, DSG transistor 312 and SSG transistor 310 each remain on for a while, e.g., between time t5 and t6, after turning off select memory cell 306.

In some implementations, word line driver 508 is configured to apply the SSG select voltage when the discharged program voltage still turns on select memory cell 306, for example, becoming the pass voltage (Vpass). In some implementations, the pass voltage is greater than the threshold voltage of select memory cell 306 to still turn on select memory cell 306. For example, the pass voltage on select word line 318 between time t3 and time t4 may be the same as or different from the pass voltage applied on unselect word line 318 between time t3 and time t4 as long as it can still turn on select memory cell 306. In other words, SSG transistor 310 may be turned on when select memory cell 306 is still turned on. As shown in FIG. 13, DSG transistor 312 and each unselect memory cell 306 can also be turned on between time t3 and time t5.

As a result, during the time between t3 and time t5, the channel (e.g., semiconductor channel 420) of NAND memory string 308 is open as each of DSG transistor 312, memory cells 306, and SSG transistor 310 is turned on, thereby breaking the negative channel coupling potential (e.g., negative channel coupling potential 914 in FIG. 9) coupled in the channel. Moreover, the open channel of NAND memory string 308 can release any accumulated holes (e.g., holes 916 in FIG. 9) from the source and drain of NAND memory string 308, which are grounded through source line 314 and bit line 316, respectively. Although both DSG transistor 312 and SSG transistor 310 are turned on according to the waveform shown in FIG. 13, since both the source and drain of NAND memory string 308 are grounded, it is understood that in some examples, turning on one of DSG transistor 312 and SSG transistor 310 may also break the negative channel coupling potential and release the accumulated holes from the channel. Accordingly, only unselect memory cells 306 between select memory cell 306 and the DSG transistor 312 and SSG transistor 310 that is turned on may be turned on to form a path for the holes accumulated at select memory cell 306 to release. Nevertheless, turn on both DSG transistor 312 and SSG transistor 310, as well as each unselect memory cell 306 may facilitate the release of the accumulated holes.

Referring back to FIGS. 10 and 12, after the clean process finishes, peripheral circuits 302 can be configured to suspend the ongoing program operation. In some implementations, control logic 512 is configured to store the information of the suspended program operation, such as the programming page, the program pass and the program/verify cycle at which the program operation is suspended, etc., which is necessary for resuming the suspended program operation, into registers 514. Control logic 512 can then send control signals to other peripheral circuits 302 to perform the other operation triggered by the received interrupt command, for example, row decoder/word line driver 508, column decoder/bit line driver 506, and voltage generator 510 to perform a read operation on another page 320 of memory cell array 301. That is, memory device 300 can enter into the program suspension state (represented by the dashed line) after the clean process.

In response to the completion of the other operation triggered by the interrupt, peripheral circuits 302 can be configured to resume the suspended program operation. In some implementations, control logic 512 is further configured to retrieve the information of the suspended program operation stored in registers 514 and send control signals to at least row decoder/word line driver 508, column decoder/bit line driver 506, and voltage generator 510 to resume the suspended program operation based on the retrieved information from registers 514, according to some implementations. As shown in FIGS. 10 and 12, once the program operation is resumed, in the same program/verify cycle, a verify voltage (e.g., Vvf_n−1, Vvf_n, or Vvf_n+1) can be applied to check whether the threshold voltage of each programmed memory cell 306 reaches the verify voltage. If one or more memory cells (verification-failed memory cells) fail to pass the verification, i.e., their threshold voltages are below the verify voltage, a subsequent program/verify cycle may be applied on the verification-failed memory cells with an increased program voltage. Compared with the existing scheme described above in FIGS. 6 and 7 that may cause false verification of select memory cell 306 due to accumulated holes, the verification of select memory cell 306 will not be affected by the accumulated holes. Thus, the FBC and performance of memory device 300 during subsequent read operations on select memory cell 306 can be improved.

Figure 14:
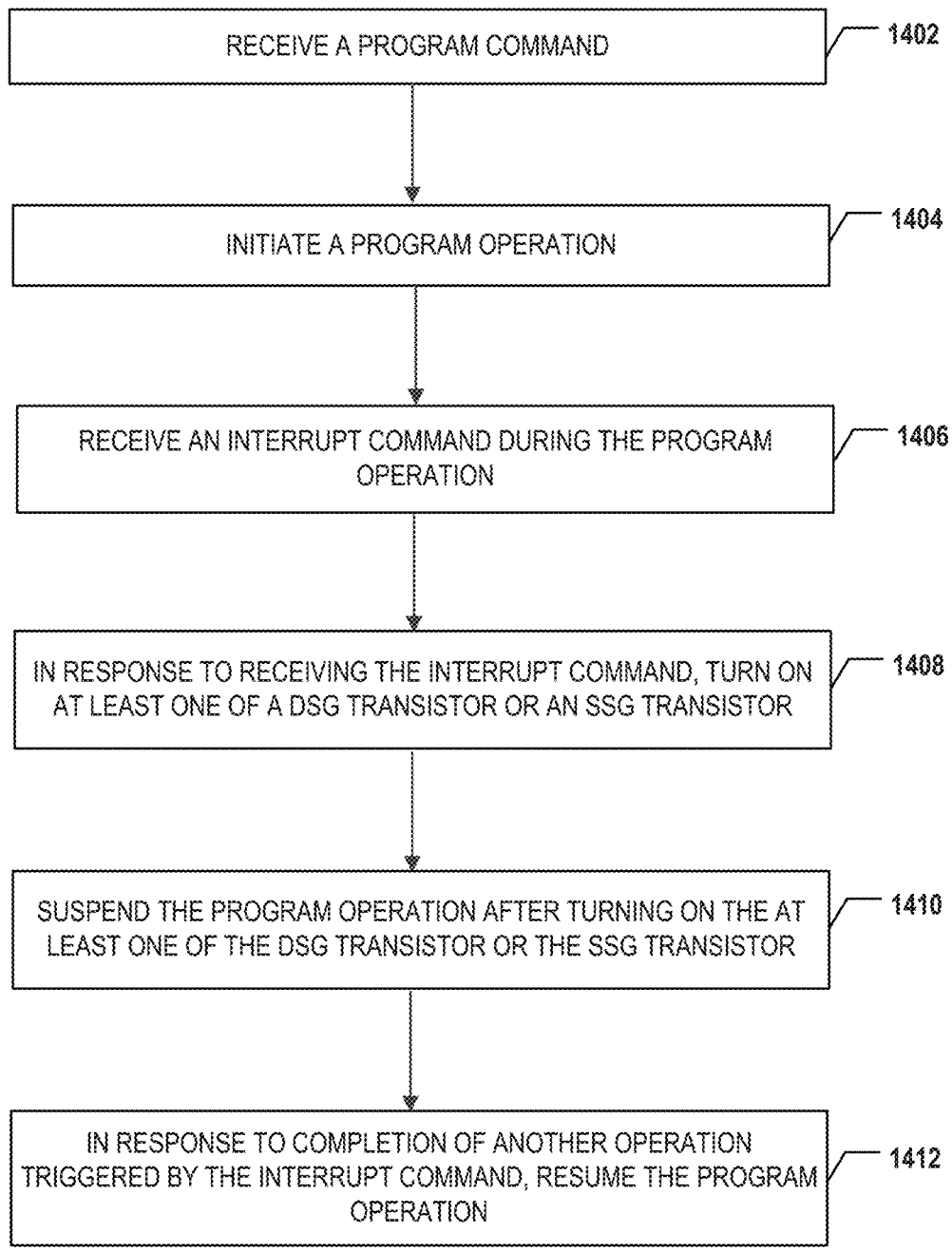
FIG. 14 illustrates a flowchart of a method for operating a memory device, according to some aspects of the present disclosure.

FIG. 14 illustrates a flowchart of a method 1400 for operating a memory device, according to some aspects of the present disclosure. The memory device may be any suitable memory device disclosed herein, such as memory device 300. Method 1400 may be implemented by peripheral circuits 302, such as control logic 512 and row decoder/word line driver 508. It is understood that the operations shown in method 1400 may not be exhaustive and that other operations can be performed as well before, after, or between any of the illustrated operations. Further, some of the operations may be performed simultaneously, or in a different order than shown in FIG. 14.

Referring to FIG. 14, method 1400 starts at operation 1402, in which a program command is received. For example, control logic 512 may receive a program operation on select memory cells 306 in a select page 320 of memory cell array 301 from memory controller 106 through interface 516.

Method 1400 proceeds to operation 1404, as illustrated in FIG. 14, in which a program operation is initiated in response to receiving the program command. For example, control logic 512 may send control signals to at least row decoder/word line driver 508, column decoder/bit line driver 506, and voltage generator 510 to initiate the program operation on select memory cell 306 coupled to select word line 318. In some implementations, as shown in FIGS. 15A and 15B, word line driver 508 applies a program voltage on select word line 318 to program select memory cell 306 on operation 1502.

Method 1400 proceeds to operation 1406, as illustrated in FIG. 14, in which an interrupt command is received during the program operation. In some implementations, the interrupt command is received while applying the program voltage on the select word line. For example, during the ongoing program operation, control logic 512 may receive an interrupt command from memory controller 106. The interrupt command may be issued by memory controller 106 when an interrupt occurs. The interrupt may be any request by host 108 that needs to interrupt the ongoing program operation, so that the event can be processed in a timely manner.

Method 1400 proceeds to operation 1408, as illustrated in FIG. 14, in which in response to receiving the interrupt command, at least one of the DSG transistor or the SSG transistor is turned on. For example, the SSG transistor may be turned on. In some implementations, the select memory cell and an unselect memory cell, which is between the select memory cell and the at least one of the DSG transistor or the SSG transistor, are turned on while turning on the at least one of the DSG transistor or the SSG transistor. In some implementations, at least one of the drain or the source of the memory string is grounded when the at least one of the DSG transistor or the SSG transistor is turned on. For example, word line driver 508 may apply an SSG voltage on SSG line 315 coupled to SSG transistor 310 to turn on SSG transistor 310 after applying the program voltage on select word line 318.

Figure 15A:
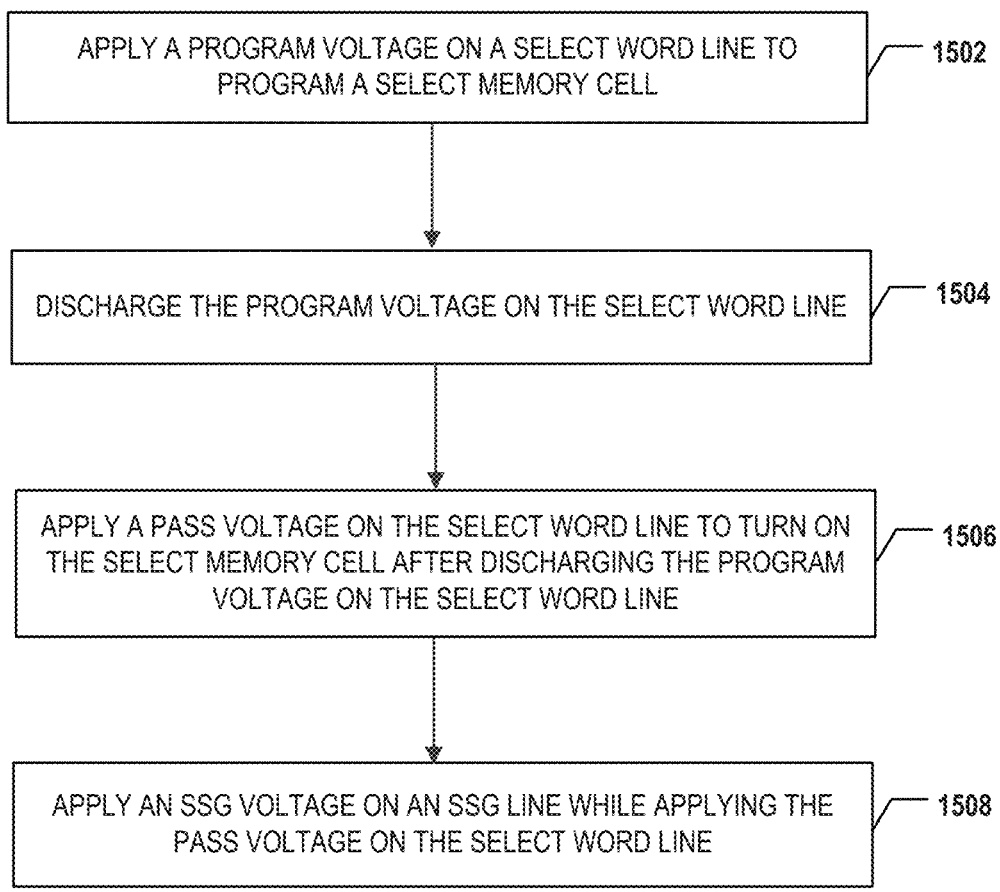
FIG. 15A illustrates a flowchart of a method for releasing holes accumulated when a program operation is suspended in response to an interrupt, according to some aspects of the present disclosure.
Figure 15B:
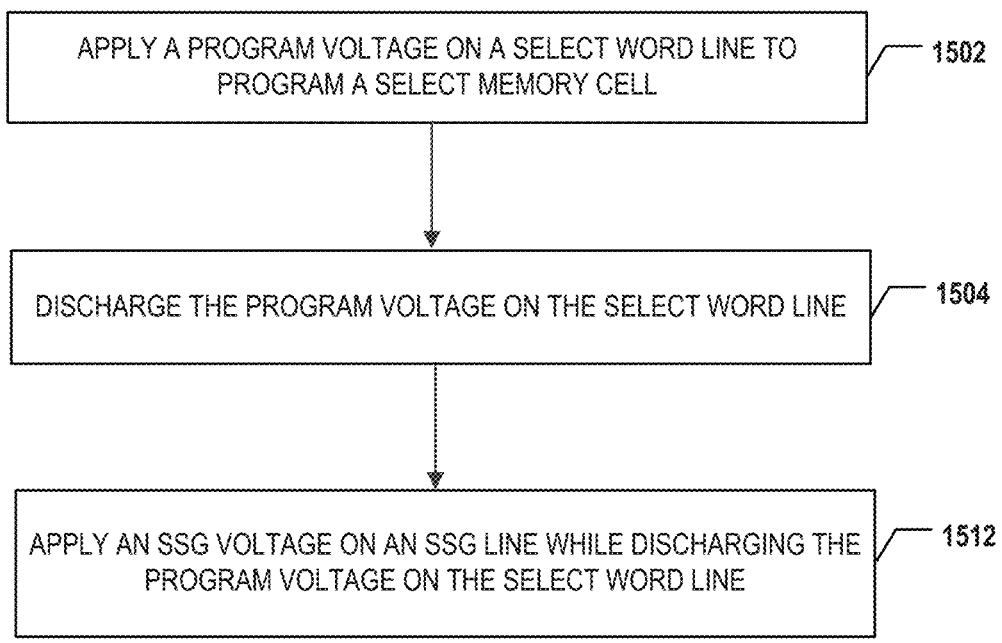
FIG. 15B illustrates a flowchart of another method for releasing holes accumulated when a program operation is suspended in response to an interrupt, according to some aspects of the present disclosure.

As shown in FIG. 15A, in some implementations, word line driver 508 discharges the program voltage on select word line 318 on operation 1504, and then at operation 1506, applies a pass voltage on select word line 318 to turn on select memory cell 306 after discharging the program voltage on select word line 318. In some implementations, at operation 1508, word line driver 508 applies the SSG voltage on SSG line 315 to turn on SSG transistor 310 while applying the pass voltage on select word line 318.

As shown in FIG. 15B, in some implementations, word line driver 508 discharges the program voltage on select word line 318 on operation 1504, and then at operation 1512, applies the SSG voltage on SSG line 315 to turn on SSG transistor 310 while discharging the program voltage on select word line 318. For example, word line driver 508 may apply the SSG voltage when the discharged program voltage still turns on select memory cell 306.

In some implementations, word line drivers 508 also applies a pass voltage on unselect word line 318 coupled to unselect memory cell 306 to turn on unselect memory cell 306 while applying the program voltage on select word line 318 and while applying the SSG voltage on SSG line 315.

Method 1400 proceeds to operation 1410, as illustrated in FIG. 14, in which the program operation is suspended after turning on the at least one of the DSG transistor or the SSG transistor. For example, control logic 512 may store the information of the suspended program operation into registers 514 and then send control signals to at least row decoder/word line driver 508, column decoder/bit line driver 506, and voltage generator 510 to suspend the ongoing program operation and perform another operation (e.g., a read operation) triggered by the received interrupt command.

Method 1400 proceeds to operation 1412, as illustrated in FIG. 14, in which in response to completion of another operation triggered by the interrupt command, the program operation is resumed. For example, in response to the completion of the other operation, control logic 512 may retrieve the information of the suspended program operation stored in registers 514 and send control signals to row decoder/word line driver 508, column decoder/bit line driver 506, and voltage generator 510 to resume the suspended program operation based on the retrieved information from registers 514.

According to one aspect of the present disclosure, a memory device includes a memory string including a DSG transistor, a plurality of memory cells, and an SSG transistor, and a peripheral circuit coupled to the memory string. The peripheral circuit is configured to in response to an interrupt during a program operation on a select memory cell of the plurality of memory cells, turn on at least one of the DSG transistor or the SSG transistor. The peripheral circuit is also configured to suspend the program operation after turning on the at least one of the DSG transistor or the SSG transistor.

In some implementations, the peripheral circuit is further configured to turn on the select memory cell, and an unselect memory cell of the plurality of memory cells while turning on the at least one of the DSG transistor or the SSG transistor. The unselect memory cell can be between the select memory cell and the at least one of the DSG transistor or the SSG transistor.

In some implementations, at least one of a drain or a source of the memory string is grounded when the at least one of the DSG transistor or the SSG transistor is turned on.

In some implementations, the peripheral circuit is further configured to, in response to completion of another operation triggered by the interrupt, resume the program operation. In some implementations, the another operation includes a read operation.

In some implementations, the peripheral circuit is configured to turn on the SSG transistor.

In some implementations, the memory device further includes a select word line coupled to the select memory cell, and an SSG line coupled to the SSG transistor. In some implementations, the peripheral circuit comprises a word line driver configured to apply a program voltage on the select word line to program the select memory cell, and apply an SSG voltage on the SSG line to turn on the SSG transistor after applying the program voltage on the select word line.

In some implementations, the memory device further includes an unselect word line coupled to an unselect memory cell of the plurality of memory cells. In some implementations, the word line driver is further configured to apply a pass voltage on the unselect word line to turn on the unselect memory cell while applying the program voltage on the select word line and while applying the SSG voltage on the SSG line.

In some implementations, the word line driver is further configured to discharge the program voltage on the select word line, apply a pass voltage on the select word line to turn on the select memory cell after discharging the program voltage on the select word line, and apply the SSG voltage on the SSG line while applying the pass voltage on the select word line.

In some implementations, the word line driver is further configured to discharge the program voltage on the select word line, and apply the SSG voltage on the SSG line while discharging the program voltage on the select word line.

In some implementations, the word line driver is further configured to apply the SSG voltage when the discharged program voltage still turns on the select memory cell.

In some implementations, the interrupt occurs while applying the program voltage on the select word line.

According to another aspect of the present disclosure, a system includes a memory device configured to store data, a memory controller coupled to the memory device, and a connector configured to couple the system to a host. The memory device includes a memory string including a DSG transistor, a plurality of memory cells, and an SSG transistor, and a peripheral circuit coupled to the memory string. The peripheral circuit is configured to initiate a program operation on a select memory cell of the plurality of memory cells, and receive an interrupt command during the program operation. The peripheral circuit is also configured to in response to receiving the interrupt command, turn on at least one of the DSG transistor or the SSG transistor. The peripheral circuit is further configured to suspend the program operation after turning on the at least one of the DSG transistor or the SSG transistor. The memory controller is configured to transmit a program command to the peripheral circuit to initiate the program operation, and transmit the interrupt command after the program command to the peripheral circuit.

In some implementations, the system is an SSD or a memory card.

According to still another aspect of the present disclosure, a method for operating a memory device is provided. The memory device includes a memory string including a DSG transistor, a plurality of memory cells, and an SSG transistor. A program operation is initiated on a select memory cell of the plurality of memory cells. An interrupt command is received during the program operation. In response to receiving the interrupt command, at least one of the DSG transistor or the SSG transistor is turned on. The program operation is suspended after turning on the at least one of the DSG transistor or the SSG transistor.

In some implementations, the select memory cell and an unselect memory cell of the plurality of memory cells are turned on while turning on the at least one of the DSG transistor or the SSG transistor. The unselect memory cell can be between the select memory cell and the at least one of the DSG transistor or the SSG transistor.

In some implementations, at least one of a drain or a source of the memory string is grounded when the at least one of the DSG transistor or the SSG transistor is turned on.

In some implementations, in response to completion of another operation triggered by the interrupt command, the program operation is resumed. In some implementations, the another operation includes a read operation.

In some implementations, to turn on the at least one of the DSG transistor or the SSG transistor, the DSG transistor is turned on.

In some implementations, a program voltage is applied on a select word line coupled to the select memory cell to program the select memory cell, and an SSG voltage is applied on an SSG line coupled to the SSG transistor to turn on the SSG transistor after applying the program voltage on the select word line.

In some implementations, a pass voltage is applied on an unselect word line coupled to an unselect memory cell of the plurality of memory cells to turn on the unselect memory cell while applying the program voltage on the select word line and while applying the SSG voltage on the SSG line.

In some implementations, the program voltage is discharged on the select word line, a pass voltage is applied on the select word line to turn on the select memory cell after discharging the program voltage on the select word line, and the SSG voltage is applied on the SSG line while applying the pass voltage on the select word line.

In some implementations, the program voltage on the select word line is discharged, and the SSG voltage is applied on the SSG line while discharging the program voltage on the select word line.

In some implementations, to apply the SSG voltage, the SSG voltage is applied when the discharged program voltage still turns on the select memory cell.

In some implementations, the interrupt command is received while applying the program voltage on the select word line.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a memory string comprising a drain select gate (DSG) transistor, a plurality of memory cells, and a source select gate (SSG) transistor; and
a peripheral circuit coupled to the memory string and configured to:
in response to an interrupt during a program operation on a select memory cell of the plurality of memory cells, turn on at least one of the DSG transistor or the SSG transistor; and
suspend the program operation after turning on the at least one of the DSG transistor or the SSG transistor.

2. The memory device of claim 1, wherein the peripheral circuit is further configured to turn on the select memory cell, and an unselect memory cell of the plurality of memory cells while turning on the at least one of the DSG transistor or the SSG transistor, the unselect memory cell being between the select memory cell and the at least one of the DSG transistor or the SSG transistor.

3. The memory device of claim 1, wherein at least one of a drain or a source of the memory string is grounded when the at least one of the DSG transistor or the SSG transistor is turned on.

4. The memory device of claim 1, wherein the peripheral circuit is further configured to, in response to completion of another operation triggered by the interrupt, resume the program operation.

5. The memory device of claim 4, wherein the another operation comprises a read operation.

6. The memory device of claim 1, wherein the peripheral circuit is configured to turn on the SSG transistor.

7. The memory device of claim 6, further comprising:
a select word line coupled to the select memory cell; and
an SSG line coupled to the SSG transistor,
wherein the peripheral circuit comprises a word line driver configured to:
apply a program voltage on the select word line to program the select memory cell; and
apply an SSG voltage on the SSG line to turn on the SSG transistor after applying the program voltage on the select word line.

8. The memory device of claim 7, further comprising an unselect word line coupled to an unselect memory cell of the plurality of memory cells,
wherein the word line driver is further configured to apply a pass voltage on the unselect word line to turn on the unselect memory cell while applying the program voltage on the select word line and while applying the SSG voltage on the SSG line.

9. The memory device of claim 7, wherein the word line driver is further configured to:
discharge the program voltage on the select word line;
apply a pass voltage on the select word line to turn on the select memory cell after discharging the program voltage on the select word line; and
apply the SSG voltage on the SSG line while applying the pass voltage on the select word line.

10. The memory device of claim 7, wherein the word line driver is further configured to:

discharge the program voltage on the select word line; and
apply the SSG voltage on the SSG line while discharging the program voltage on the select word line.

11. The memory device of claim 10, wherein the word line driver is further configured to apply the SSG voltage when the discharged program voltage still turns on the select memory cell.

12. The memory device of claim 7, wherein the interrupt occurs while applying the program voltage on the select word line.

13. A system, comprising:
a memory device configured to store data and comprising:
a memory string comprising a drain select gate (DSG) transistor, a plurality of memory cells, and a source select gate (SSG) transistor; and
a peripheral circuit coupled to the memory string and configured to:
initiate a program operation on a select memory cell of the plurality of memory cells;
receive an interrupt command during the program operation;
in response to receiving the interrupt command, turn on at least one of the DSG transistor or the SSG transistor; and
suspend the program operation after turning on the at least one of the DSG transistor or the SSG transistor;
a memory controller coupled to the memory device and configured:
transmit a program command to the peripheral circuit to initiate the program operation; and
transmit the interrupt command after the program command to the peripheral circuit; and
a connector configured to couple the system to a host.

14. A method for operating a memory device comprising a memory string, the memory string comprising a drain select gate (DSG) transistor, a plurality of memory cells, and a source select gate (SSG) transistor, the method comprising:
initiating a program operation on a select memory cell of the plurality of memory cells;
receiving an interrupt command during the program operation;
in response to receiving the interrupt command, turning on at least one of the DSG transistor or the SSG transistor; and
suspending the program operation after turning on the at least one of the DSG transistor or the SSG transistor.

15. The method of claim 14, further comprising turning on the select memory cell and an unselect memory cell of the plurality of memory cells while turning on the at least one of the DSG transistor or the SSG transistor, the unselect memory cell being between the select memory cell and the at least one of the DSG transistor or the SSG transistor.

16. The method of claim 14, wherein at least one of a drain or a source of the memory string is grounded when the at least one of the DSG transistor or the SSG transistor is turned on.

17. The method of claim 14, wherein turning on the at least one of the DSG transistor or the SSG transistor comprises turning on the DSG transistor.

18. The method of claim 17, further comprising:
applying a program voltage on a select word line coupled to the select memory cell to program the select memory cell; and applying an SSG voltage on an SSG line coupled to the SSG transistor to turn on the SSG transistor after applying the program voltage on the select word line.

19. The method of claim 18, further comprising:

discharging the program voltage on the select word line;

applying a pass voltage on the select word line to turn on the select memory cell after discharging the program voltage on the select word line; and applying the SSG voltage on the SSG line while applying the pass voltage on the select word line.

20. The method of claim 18, further comprising:

discharging the program voltage on the select word line; and applying the SSG voltage on the SSG line while discharging the program voltage on the select word line.

* * * * *